United States Patent
Chen et al.

(10) Patent No.: US 12,527,019 B2
(45) Date of Patent: Jan. 13, 2026

(54) METHOD OF MANUFACTURING SEMICONDUCTOR DEVICES HAVING METAL GATE STRUCTURE AND SEMICONDUCTOR DEVICES

(71) Applicant: TAIWAN SEMICONDUCTOR MANUFACTURING COMPANY, LTD., Hsinchu (TW)

(72) Inventors: Yu-Ming Chen, Taipei (TW); Szu-Ying Chen, Hsinchu (TW); Yen-Chun Huang, New Taipei (TW); Sen-Hong Syue, Zhubei (TW); Huicheng Chang, Tainan (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 677 days.

(21) Appl. No.: 17/832,306

(22) Filed: Jun. 3, 2022

(65) Prior Publication Data

US 2023/0395701 A1     Dec. 7, 2023

(51) Int. Cl.
*H10D 30/01* (2025.01)
*H10D 30/66* (2025.01)
*H10D 30/67* (2025.01)

(52) U.S. Cl.
CPC ......... *H10D 30/024* (2025.01); *H10D 30/667* (2025.01); *H10D 30/6755* (2025.01)

(58) Field of Classification Search
CPC ........... H01L 29/66795; H01L 29/7812; H01L 29/7869; H01L 29/42392; H01L 29/78696; H01L 29/0673; H01L 29/42376; H01L 29/4966; H01L 29/66439; H01L 29/775; H01L 29/165; H01L 29/7848; H01L 29/66545; H01L 29/785; H01L 21/823431; B82Y 10/00
See application file for complete search history.

(56) References Cited

U.S. PATENT DOCUMENTS 9,209,273 B1  12/2015  Lin et al.
9,330,983 B1   5/2016  Cheng et al.
(Continued)

FOREIGN PATENT DOCUMENTS

TW     201837995 A    10/2018

*Primary Examiner* — Marlon T Fletcher
*Assistant Examiner* — Christina A Sylvia
(74) *Attorney, Agent, or Firm* — STUDEBAKER BRACKETT PLLC

(57) ABSTRACT

A method of manufacturing a semiconductor device includes forming a dummy gate structure over a substrate. The dummy gate structure has a dummy gate dielectric layer and a dummy gate electrode layer. Sidewall spacers including one or more layers of insulating materials are formed on sidewalls of the dummy gate structure. A silicon based liner is formed over the sidewall spacers. A first insulating layer is formed over the silicon based liner. The silicon based liner and the first insulating layer are thermally treating causing a reduction in a volume of the first insulating layer and an increase in a volume of the silicon based liner. The dummy gate structure is removed to form a gate space in the first insulating layer. The gate space is formed with a high-k dielectric layer and a first conductive layer.

20 Claims, 22 Drawing Sheets

(56) References Cited

U.S. PATENT DOCUMENTS

| | | |
|---|---|---|
| 9,431,296 B2 | 8/2016 | Basker et al. |
| 2012/0139061 A1 | 6/2012 | Ramachandran et al. |
| 2013/0187236 A1 | 7/2013 | Xie et al. |
| 2014/0008720 A1 | 1/2014 | Xie et al. |
| 2015/0145057 A1 | 5/2015 | Fan et al. |
| 2017/0207126 A1 | 7/2017 | Ching et al. |
| 2018/0174846 A1* | 6/2018 | Wang ................ H01L 21/28079 |
| 2020/0058771 A1 | 2/2020 | Cheng et al. |
| 2020/0105909 A1* | 4/2020 | Wu ...................... H10D 30/792 |
| 2020/0388626 A1* | 12/2020 | Baraskar .............. H10D 30/792 |
| 2020/0395462 A1* | 12/2020 | Lin ...................... H10D 30/024 |
| 2021/0098603 A1* | 4/2021 | Chen ................. H10D 84/0167 |

* cited by examiner

METHOD OF MANUFACTURING SEMICONDUCTOR DEVICES HAVING METAL GATE STRUCTURE AND SEMICONDUCTOR DEVICES

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1A-5A and 8-18 show an exemplary sequential manufacturing process of a semiconductor device according to one embodiment of the present disclosure. FIGS. 1B-5 and 8-18 are cross sectional views corresponding to line X1-X1 of FIG. 1A. It is understood that additional operations can be provided before, during, and after processes shown by FIGS. 1A-5 and 8-18, and some of the operations described below can be replaced or eliminated for additional embodiments of the method. The order of the operations/processes may be interchangeable.

Figure 1A:
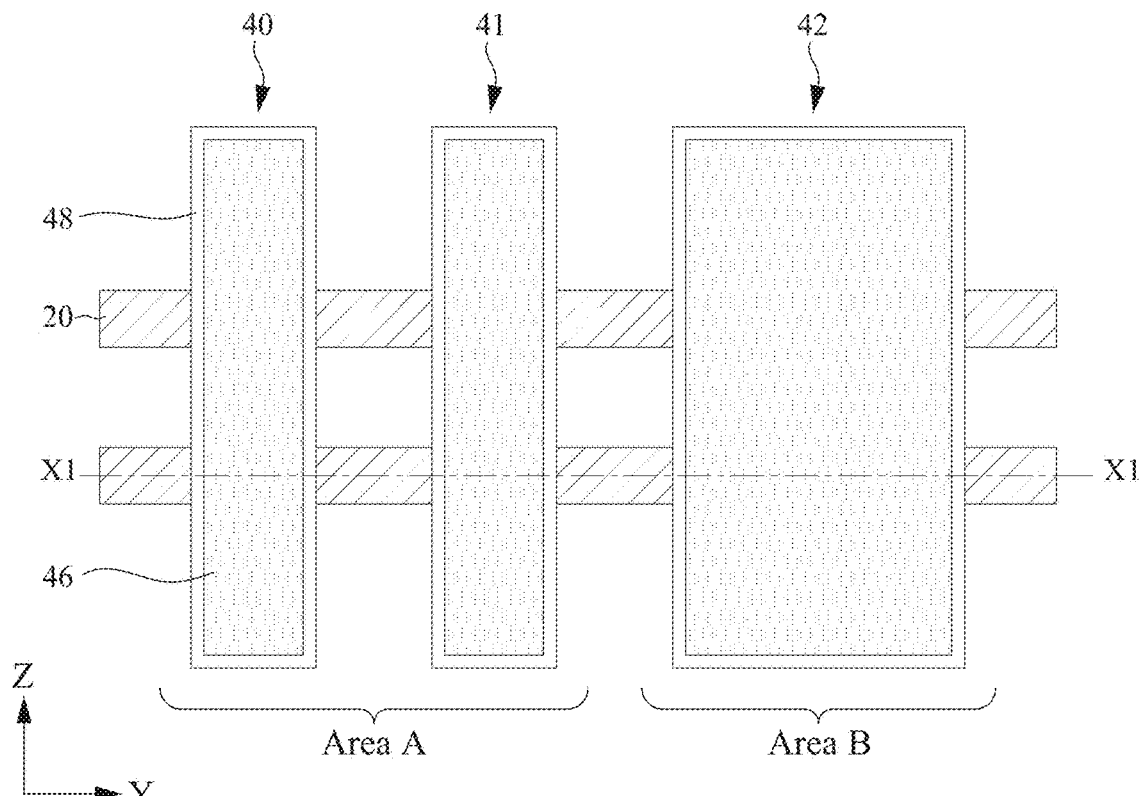
FIGS. 1A, 1B, 2, 3A, 3B, 4 and 5A show an exemplary sequential manufacturing process of a semiconductor device, according to embodiments of the present disclosure.
Figure 1B:
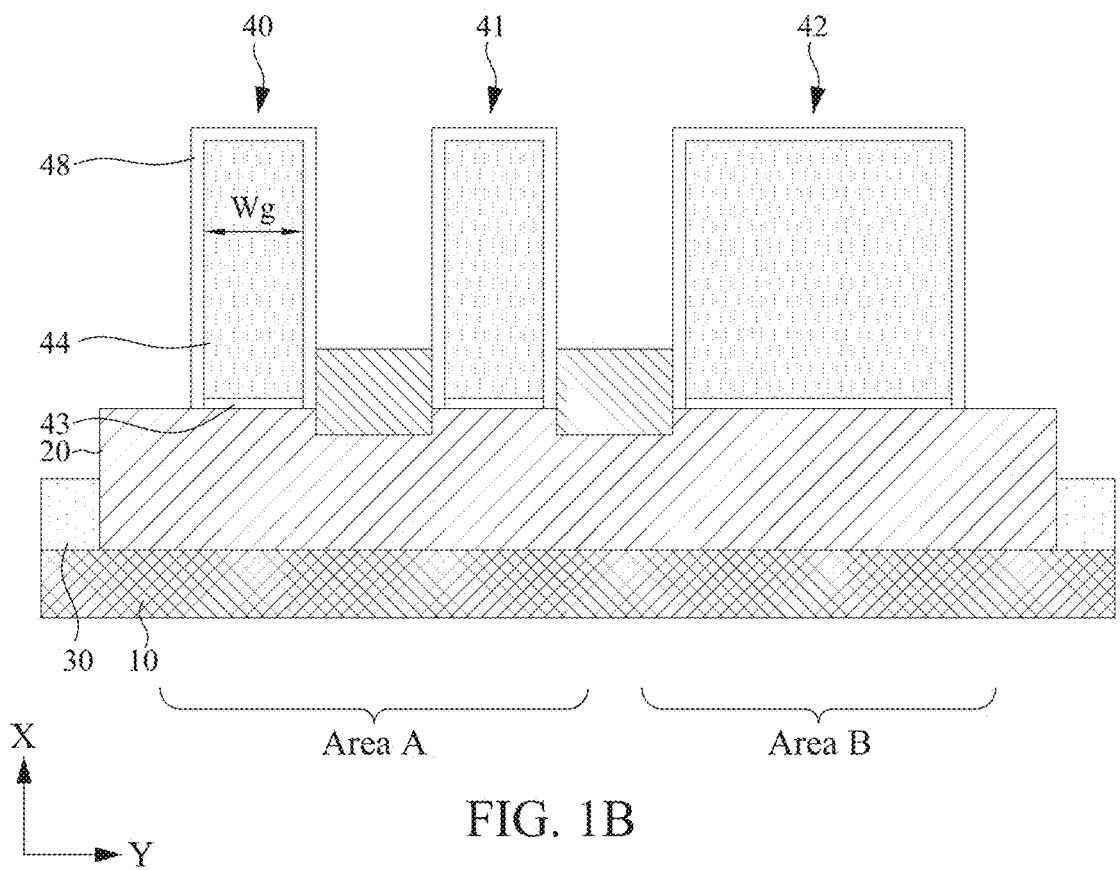

FIG. 1A shows a top view (plan view) of a structure of a semiconductor device after dummy gate structures are formed over a substrate. In FIGS. 1A and 1B, dummy gate structures 40, 41 and 42 are formed over a channel layer, for example, a part of a fin structure 20. Each of the dummy gate structures 40, 41 correspond to short-channel FETs having a gate length Lg1 and the dummy gate structure 42 corresponds to a long channel FET having a gate length Lg2, where Lg1<Lg2. In some embodiments, Lg1 is less than about 30 nm. The short-channel FETs are disposed in Area A and the long-channel FET is formed in Area B. Although the dummy gate structures 40, 41 and 42 are arranged adjacent to each other in FIGS. 1A and 1B, the arrangement is not limited to this. The dummy gate structures 40, 41 and 42 are formed separately with a distance in some embodiments.

The fin structure 20 is formed over a substrate 10 and extends from an isolation insulating layer 30. For explanation purpose, the dummy gate structures 40, 41 and 42 are formed over the same fin structure 20, but in some embodiments, dummy gate structures 40, 41 and 42 are formed over different fin structures, respectively. Similarly, although two fin structures 20 are illustrated in FIG. 1A, the number of fin structure per one gate structure is not limited to two, and may be one, or three or more.

The substrate 10 is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on insulator) substrate.

The fin structures 20 may be formed by trench-etching the substrate. After forming the fin structures 20, the isolation insulating layer 30 is formed over the fin structures 20. The isolation insulating layer 30 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 30 over the fin structures 20, a planarization operation is performed so as to remove part of the isolation insulating layer 30. The planarization operation may include a chemical mechanical polishing (CMP) and/or an etch-back process. Then, the isolation insulating layer 30 is further removed (recessed) so that the upper regions of the fin structures 20 are exposed.

Then, the dummy gate structures 40, 41 and 42 are formed over the exposed fin structures 20. The dummy gate structure includes a dummy gate electrode layer 44 made of poly silicon and a dummy gate dielectric layer 43. The dummy gate electrode layer 44 has a width Wg. Sidewall spacers 48 including one or more layers of insulating materials are also formed on sidewalls of the dummy gate electrode layer. The sidewall spacers 48 include one or more layers of insulating material such as silicon nitride based material including SiN, SiON, SiCN and SiOCN. The film thickness of the sidewall spacers 48 at the bottom of the sidewall spacers is in a range from about 3 nm to about 15 nm in some embodiments, and is in a range from about 4 nm to about 8 nm in other embodiments.

In some embodiments, the dummy gate structures further include a mask insulating layer, which is used to pattern a poly silicon layer into the dummy gate electrode layers. The thickness of the mask insulating layer is in a range from about 10 nm to about 30 nm in some embodiments, and is in a range from about 15 nm to about 20 nm in other embodiments.

Figure 2:
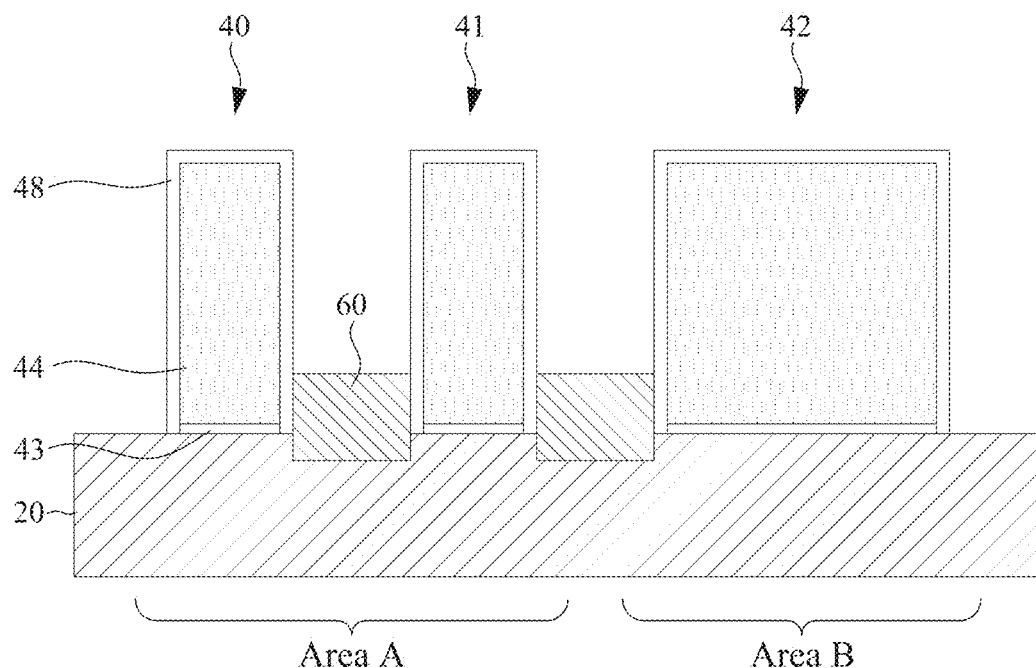

As shown in FIG. 2, after the dummy gate structures 40, 41 and 42 are formed, source/drain regions 60 are formed. In the present disclosure, a source and a drain can be interchangeably used, and the term source/drain refers to either one of a source and a drain. In some embodiments, the fin structure 20 not covered by the dummy gate structures is recessed below the upper surface of the isolation insulating layer 30. Then, the source/drain regions 60 are formed over the recessed fin structure by using an epitaxial growth method. The source/drain regions 60 may include a strain material to apply stress to the channel region. Additional source/drain regions 60 may be formed at the left of the dummy gate structure 40 and/or at the right of the dummy gate structure 42.

Then, as shown in FIG. 3, a first etching stop layer (ESL) 70 is formed over the dummy gate structures 40, 41 and 42 and the source/drain regions 60. The first ESL 70 includes one or more layers of insulating material such as silicon nitride based material including SiN. In other embodiments the first ESL 70 includes one or more layers of insulating material including SiCN or SiOCN. The thickness of the first ESL 70 is in a range from about 3 nm to about 10 nm in some embodiments. A liner 78 is then formed on the first ESL 70. The liner 78 includes one or more layers of material including silicon (Si), such as polysilicon or amorphous silicon. In some other embodiments, the liner 78 includes one or more layers of material including SiO$_2$ or SiOCN. The thickness of the liner 78 is in a range from about 1 nm (10 Å) to about 5 nm (50 Å) in some embodiments.

Figure 3A:
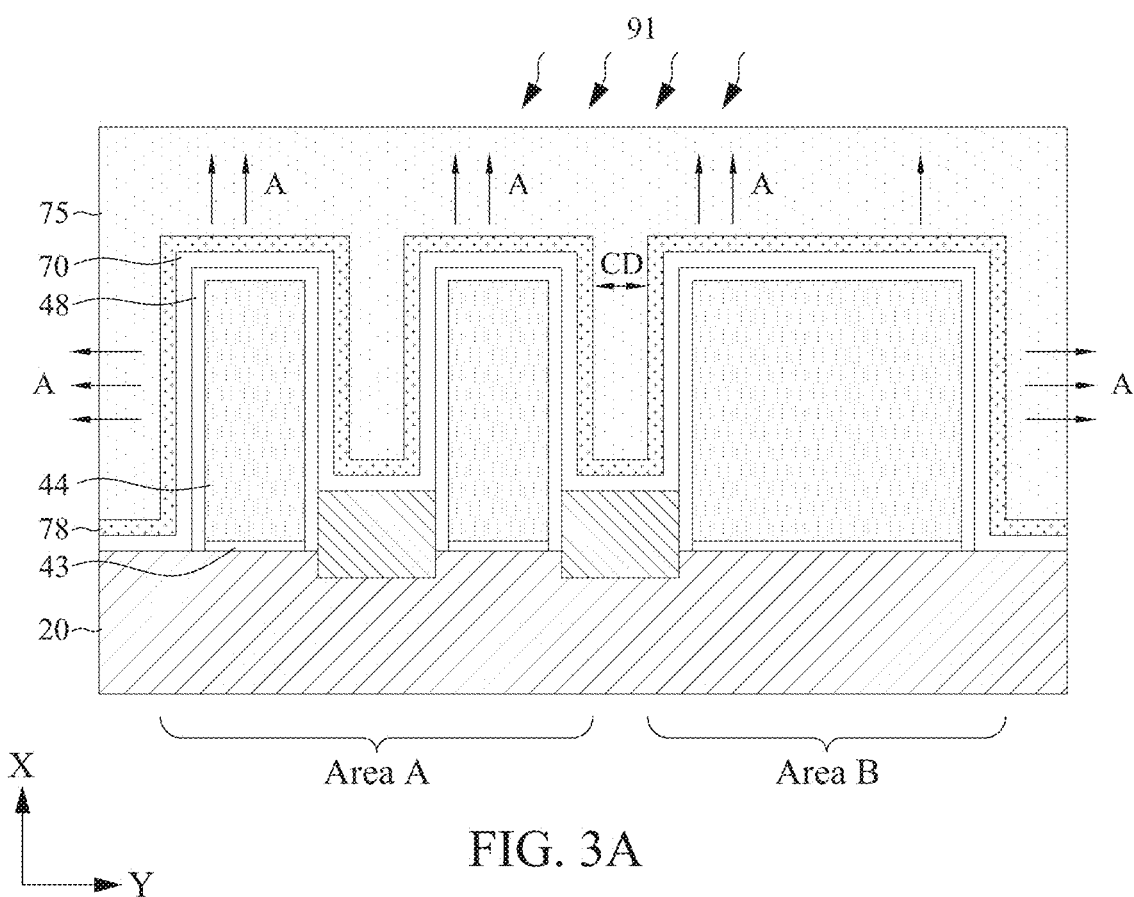

As shown in FIG. 3A, a first interlayer dielectric (ILD) layer 75 is formed over the liner 78. The first interlayer dielectric (ILD) layer 75 includes one or more layers of insulating material such as silicon oxide based material such as silicon dioxide (SiO$_2$) or SiON.

An annealing process is then performed. In some embodiments, the annealing process includes a steam annealing process in which the first interlayer dielectric (ILD) layer 75 is exposed to superheated steam 91. The superheated steam 91 is provided having a temperature from about 450° C. to about 550° C. and a pressure from about 40 barG (gauge pressure) to about 110 barG, in some embodiments. However, other types of thermal processes can also be used.

The annealing process causes the volume of the liner 78 to increase (e.g., liner 78 expands), generally indicated by the arrows A in FIG. 3A. In some embodiments, annealing process includes a wet anneal process in which the first interlayer dielectric (ILD) layer 75 is exposed to steam at a temperature in a range from about 200° C. to about 700° C. for a period in a range from about 30 min to about 120 min. The expansion reduces the gate critical dimension (CD) between the adjacent dummy gate structures 40, 41 and 42 (or, the widths of the gates spaces 81, 82, 83 (FIG. 5A, discussed below)). A desired gate CD can be obtained by controlling an amount by which the liner 78 expands.

The annealing (or other thermal) processes can cause the dimensions of the first ILD layer 75 to change. For instance, the first ILD layer 75 may reduce in volume (e.g., shrink) and thereby separate from the liner 78, as generally indicated by the arrows B in FIG. 3B. As a result, gaps (or voids) 77 may be formed between the first ILD layer 75 and the liner 78. The shrinkage of the first ILD layer 75 and the resulting gaps 77 cause a change in the gate CD that this can adversely affect the performance (e.g., electrical properties) of the semiconductor device. However, the annealing process coverts the Si liner 78 into oxide by oxygen contained in the first ILD layer 75, and this causes the volume of the liner 78 to increase. The liner 78 occupies the gaps 77 when expanding, and thereby the volume of the gaps 77 is reduced. Thus, the gaps 77 are reduced and any change in the gate CD is minimized.

Figure 4:
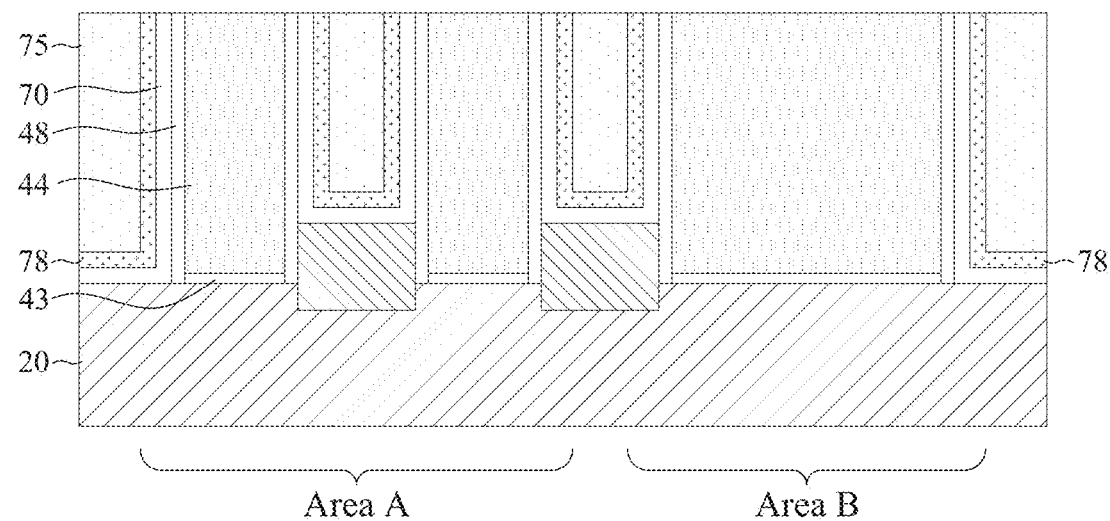

Then, as shown in FIG. 4, a planarization operation is performed so as to remove the upper portions of the dummy gate electrode layer 44, the sidewall spacers 48, the ESL 70, the first ILD layer 75, and the liner 78. The planarization operation may include a chemical mechanical polishing (CMP) and/or an etch-back process.

Figure 5A:
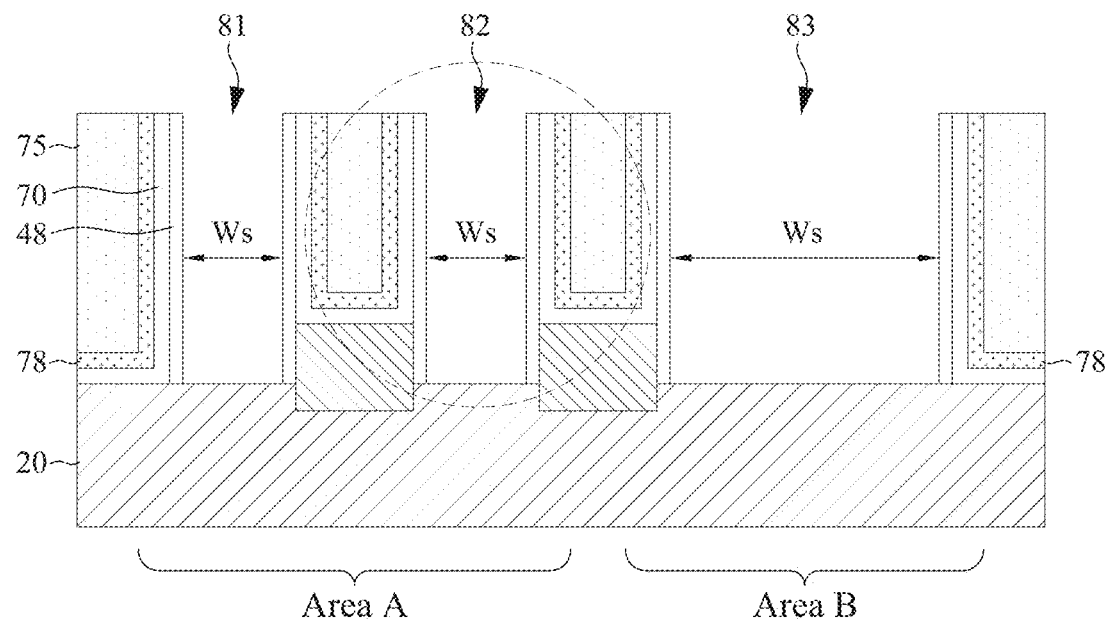

After the planarization operation on the dummy gate electrode layer 44, the sidewall spacers 48, the ESL 70, the first ILD layer 75, and the liner 78, the dummy gate structures 40, 41 and 42 each including the dummy gate electrode layer 44 made of poly silicon and a dummy gate dielectric layer 43 are removed so as to make gate spaces 81, 82 and 83, as shown in FIG. 5A. The gate spaces 81, 82, 83 have widths Ws at or adjacent a top of the corresponding dummy gate structure 40, 41, 42, and the widths Ws are smaller than the widths Wg of the corresponding dummy gate electrode layers 44 As shown in FIG. 5A, the gate sidewall spacers 48, the ESL 70, and the liner 78 remain in each of the gate spaces 81, 82, and 83. In other words, the gate sidewall spacers 48, the ESL 70, and the liner 78 line each of the gate spaces 81, 82, and 83.

The removal of the dummy gate electrode layer 44 including poly silicon relieves the stresses resulting from the increase in the volume of the liner 78. With reduced stresses, the liner 78 fills the gaps or voids, and as a result, the volume of the gaps or voids is reduced. With a reduction in the gaps, the performance of the semiconductor device is improved. Due to the expansion, the gate CD (width of the gate space) is also reduced. The amount of expansion (volume change), and thereby the gate CD, can be controlled (or tuned) based on the material and/or thickness of the liner 78.

Figure 5B:
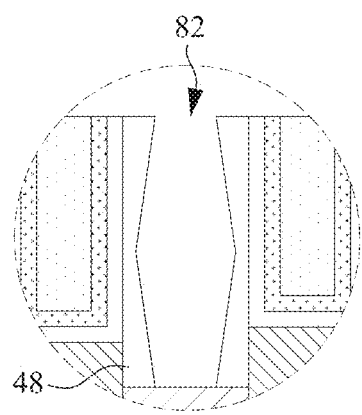
FIG. 5B illustrates the sidewall spacer having an arc shape or bow shape, according to embodiments of the disclosure.
Figure 5C:
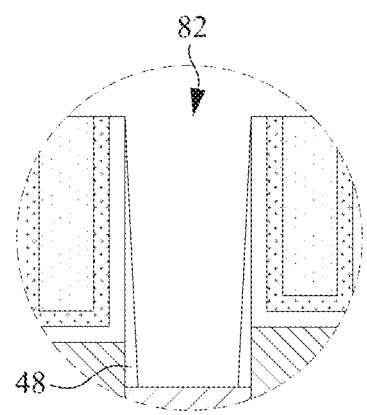
FIG. 5C illustrates the gate space having a funnel shape, according to embodiments of the disclosure.

In some embodiments, the liner 78, which has expanded through the annealing (e.g., oxidation), pushes the ESL 70 and the sidewall spacer 48 toward the gate space, thereby decreases the gate CD. In some embodiments, the sidewall spacer 48 has an arc shape or bow shape. In some embodiments, the gate space, in particular, the gate spaces 81 and 82, has a funnel shape having the top greater in width than the bottom. FIGS. 5B and 5C illustrate different shapes of the sidewall spacer 48 and the gate space 82 in the encircled portion in FIG. 5A. FIG. 5B illustrates the sidewall spacer 48 having an arc shape or bow shape, according to embodiments of the disclosure. FIG. 5C illustrates the gate space 82 having a funnel shape (or V shape), according to embodiments of the disclosure. The V-shaped profile provides for improved gap filling since the sidewall spacer 48 is relatively fixed at the bottom and the top portions moved with relative ease. In some embodiments, the contact points of the sidewall spacer 48 to the fin structure 20 and/or the isolation insulating layer 30 do not move. It should be noted that the shapes of the sidewall spacer 48 and the gate space 82 in FIGS. 5A and 5C have been exaggerated for sake of illustration.

Figure 6:
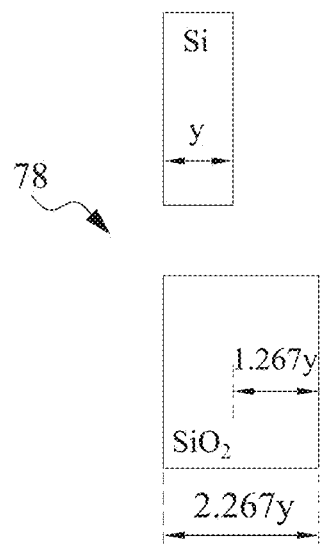
FIG. 6 illustrates a relationship between the liner thickness before and after thermal processing, according to embodiments of the present disclosure.

Referring to the orientation in FIG. 3A, if the horizontal thickness of the liner 78 is y units and the liner 78 is composed of Si, then the liner 78 expands by around 1.267y units for a total thickness of around 2.267y units. FIG. 6 illustrates this relationship diagrammatically. If the thickness of the line 78 is y units and the total thickness is around 2.267y units after annealing, then the change in y (Δy) because of the annealing is given by Δy=1.267y. As an example, assuming the CD of the first ILD 75 to be 17 mm and the volume change after annealing is about 12%, then gate CD expansion is obtained as 17×0.12=2.04 mm. The change in the gate CD (ΔGate CD) is then calculated as ΔGate CD=2.04−1.267y×2=2.04−2.534y. As is understood, the ΔGate CD=2.04 when horizontal thickness of the liner 78 is y is zero, in other words, in the absence of the liner 78. The ΔGate CD=2.04 thus indicates the increase in the gate CD after the annealing process. For sake of explanation, the embodiments discuss the horizontal expansion of the liner 78. However, it should be noted that the portion of the liner 78 on top of the dummy gate structures 40, 41 and 42 may expand vertically, and the discussion is equally applicable such an expansion of the liner 78.

When the liner 78 includes $SiO_2$, annealing causes a relatively lesser volume increase (expansion) in the liner 78 compared to when the liner 78 includes Si. During the annealing process, the liner 78 expands at a relatively slower rate (compare to the liner 78 including Si) and fills any gaps 77 such that change in the gate CD (ΔGate CD) approaches zero. Thus, depending on the material in the liner 78, the rate of expansion of the liner 78 can be varied based on the different gate CD and structure of the semiconductor device.

Figure 7:
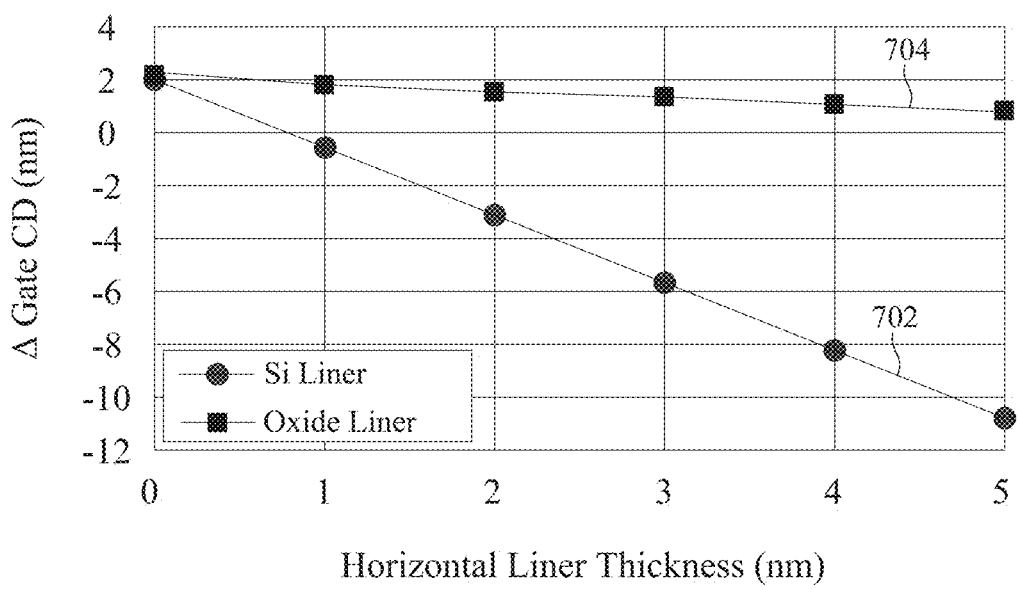
FIG. 7 is a graph that illustrates the change in the gate CD for different thicknesses of the liner, according to embodiments of the present disclosure.

FIG. 7 is a graph that illustrates the change in the gate CD for different thicknesses of the liner 78, according to embodiments. In FIG. 7, trace 702 depicts the variation in the gate CD for different thicknesses of liner 78 composed of Si. In FIG. 7, trace 704 depicts the variation in the gate CD for different thicknesses of liner 78 composed of $SiO_2$. As seen, the trace 702 is much higher slope than the trace 704, indicating that the variation in the gate CD when using a liner 78 including Si is greater than the variation in the gate CD when using a liner 78 including $SiO_2$. In other words, the change in the volume of the liner 78 including Si is greater than the change in the volume of the liner 78 including $SiO_2$. Thus, by choosing an appropriate liner material and thickness, the gate profile can be modulated (adjusted) to obtain a desired gate CD. It should be noted that the change in the gate CD (ΔGate CD) may not be the in all the gate spaces. For instance, the (ΔGate CD) of area A and the (ΔGate CD) of area B can be different. For the sake of explanation, it is assumed that the liner 78 expands uniformly throughout.

Figure 8:
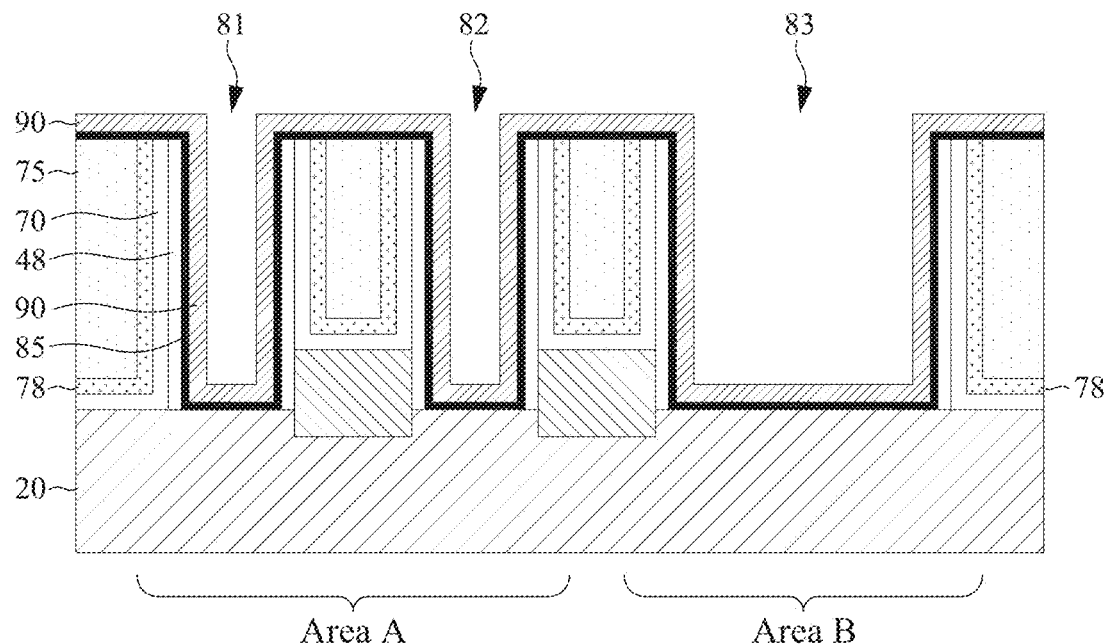
FIGS. 8, 9, 10, 11, 12A, 12B, 13, 14, 15, 16, 17 and 18 show an exemplary sequential manufacturing process of a semiconductor device, according to embodiments of the present disclosure.

Then, as shown in FIG. 8, a gate dielectric layer 85 is formed lining the gate spaces 81, 82, and 83 and contacting the gate spacer 48 in the gate spaces 81, 82, and 83, and over the first ILD 75, the liner 78, the ESL 70, and the gate spacer 48. The gate dielectric layer 85 includes one or more layers of dielectric material, such as a high-k metal oxide. Examples of the metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interfacial layer made of, for example, silicon oxide, is formed over the fin structure (channel region) before forming the gate dielectric layer 85. A blanket layer of a suitable dielectric material is formed by using CVD, PVD, ALD or other suitable film forming methods.

Further, as illustrated, a work function adjustment (WFA) layer 90 for a p-channel FET is formed in the gate spaces 81, 82 and 83. A blanket layer of a suitable conductive material is formed over the gate spaces 81, 82 and 83 and the first ILD layer 75, the liner 78, the ESL 70, and the gate spacer 48. The WFA layer 90 includes one or more layers of conductive material. Examples of the WFA layer 90 for a p-channel FET include Ti, TiAlC, Al, TiAl, TaN, TaAlC, TiN, TiC and Co. In one embodiment, TiN is used for a p-channel FET. Examples of the WFA layer 90 for an n-channel FET include TiN, TaN, TaAlC, TiC, TiAl, TaC, Co, Al, TiAl, HfTi, TiSi, TaSi or TiAlC. In one embodiment, TaAlC, TiAl or Al is used for an n-channel FET. The thickness of the WFA layer 90 is in a range from about 3 nm to about 10 nm in some embodiments. The WFA layer 90 may be formed by chemical vapor deposition (CVD), physical vapor deposition (PVD) including sputtering, atomic layer deposition (ALD) or other suitable method. As shown in FIG. 8, the WFA layer 90 is conformally formed in the gate spaces 81, 82 and 83.

Figure 9:
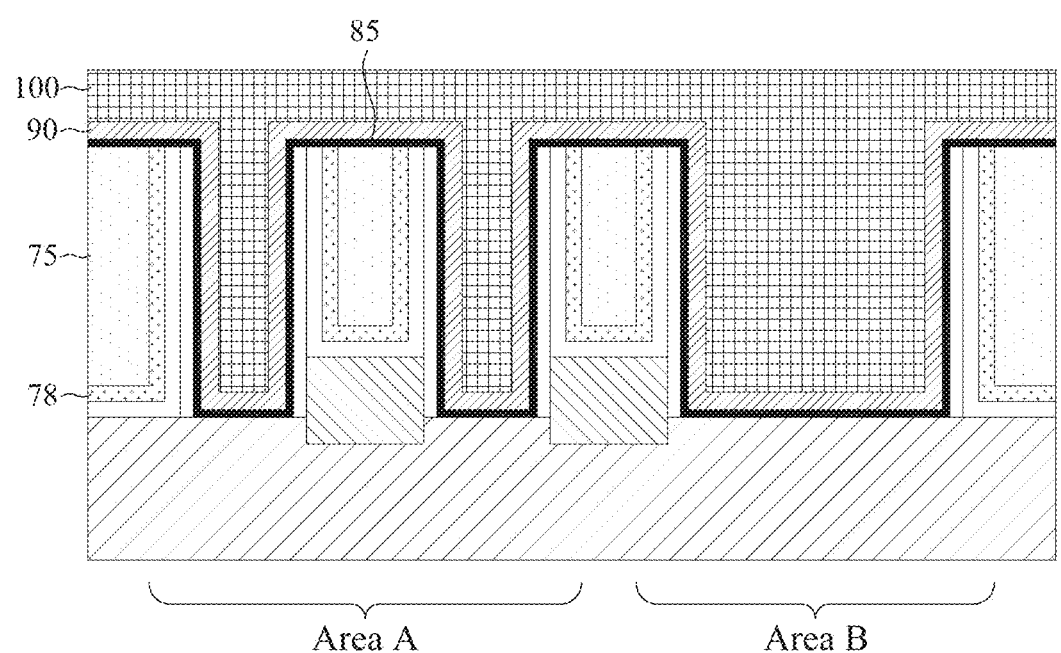

Then, as shown in FIG. 9, a first metal material 100 is formed over the structure of FIG. 8. The first metal material includes one or more layers of metal material, such as Al, Co, Cu, W, Ti, Ta, TiN, TiAl, TiAlC, TiAlN, TaN, NiSi, CoSi, other conductive materials. In one embodiment, W, Co or Al is used. The first metal material is formed by CVD, PVD, ALD, electroplating or other suitable methods. The first metal material 100 is made of a different material than the WFA layer 90.

Figure 10:
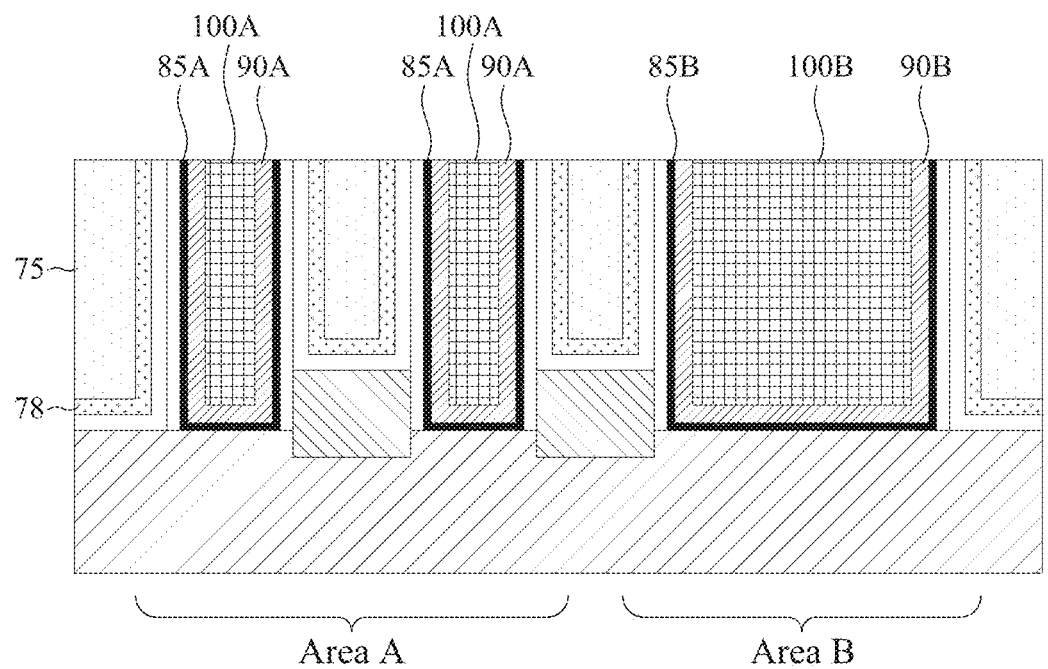

Then, as shown in FIG. 10, a planarization operation is performed so as to remove the upper portion of the deposited first metal material 100. After the planarization operation, the first conductive layer 100A for a metal gate electrode of a short channel FET and the first conductive layer 100B for a metal gate electrode of a long channel FET are formed in each of the gate spaces. The short channel FETs in Area A also include a gate dielectric layer 85A and a WFA layer 90A, and the long channel FET in Area B also includes a gate dielectric layer 85B and a WFA layer 90B. The planarization operation may include a chemical mechanical polishing (CMP) and/or an etch-back process.

Figure 11:
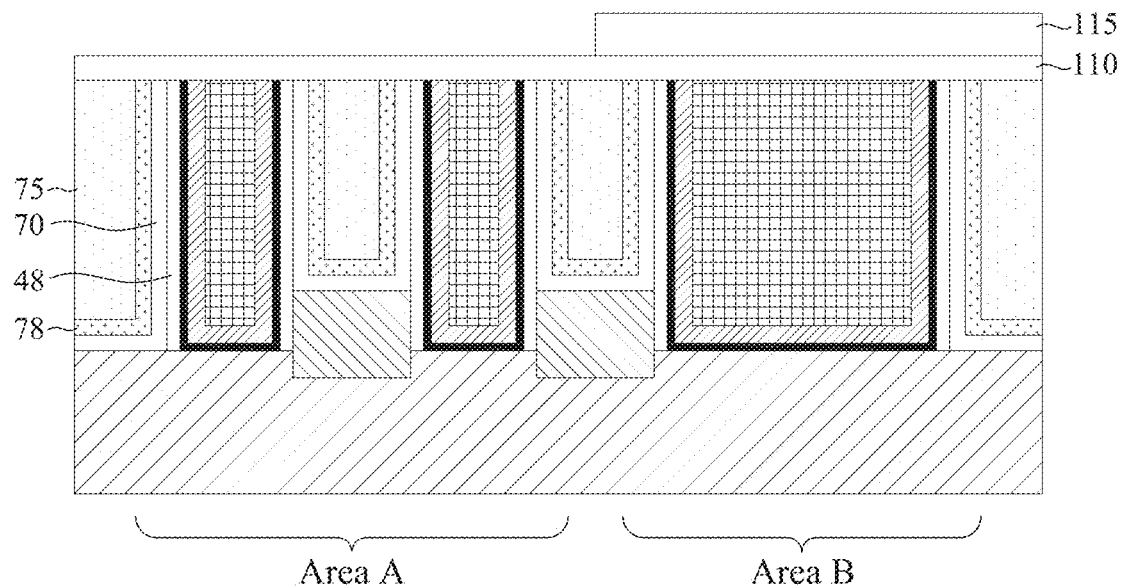

Subsequently, a protective layer 110 is formed over the structure of FIG. 10 and a mask pattern 115 is formed so as to cover Area B for the long channel FET, as shown in FIG. 11. The protective layer 110 includes one or more layers of insulating material, such as SiN. The mask pattern 115 is a photo resist pattern in some embodiments.

Figure 12A:
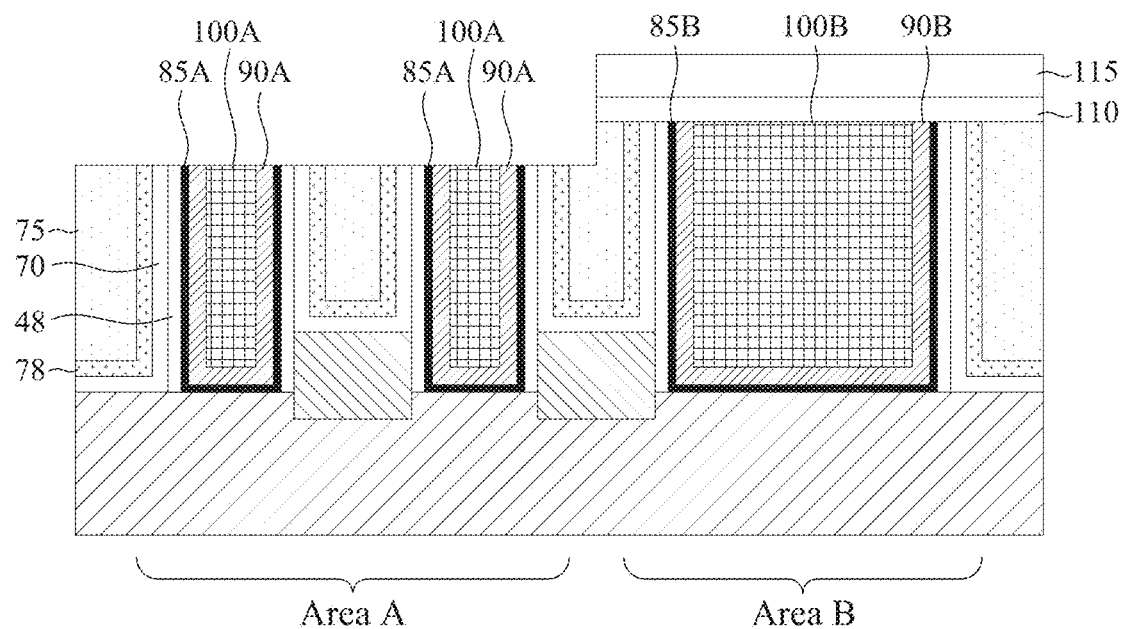
Figure 12B:
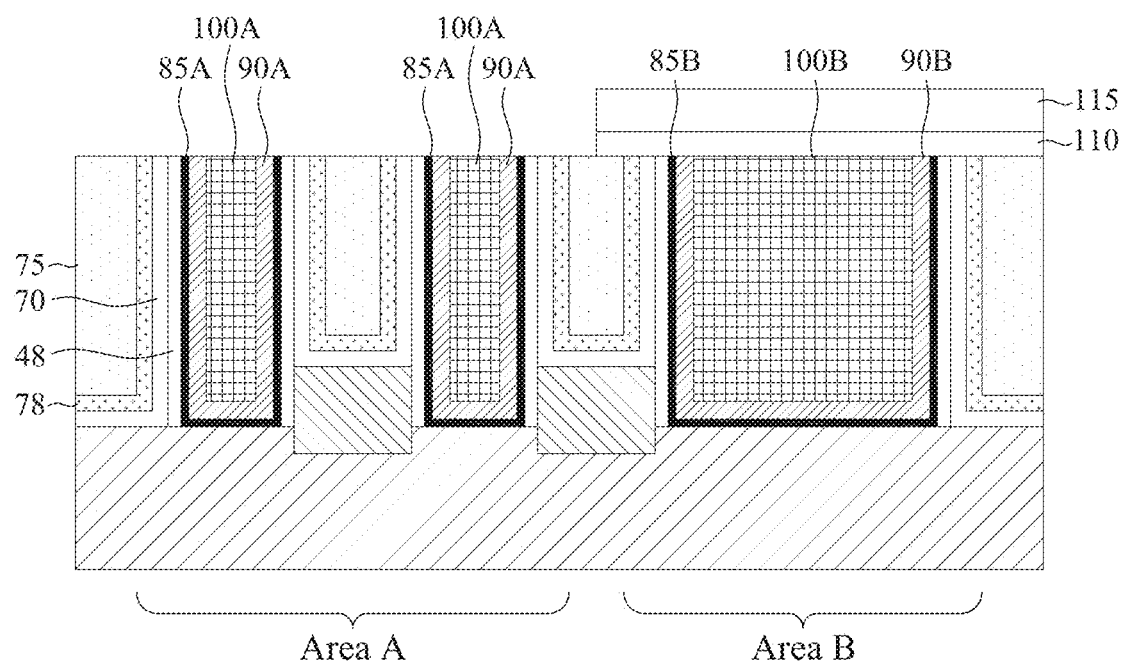

By using the mask pattern 115 as an etching mask, the protective layer 110 is patterns to open an area above Area A. Then, by using the patterned protective layer 110 as an etching mask, the upper portion of the first conductive layer 100A, the gate dielectric layer 85A, the WFA layer the sidewall spacers 48, the first ESL 70 and the first ILD layer 75 are recessed, as shown in FIG. 12A. In some embodiments, the mask pattern 115 remains on the protective layer 110. In other embodiments, the upper portion of the first conductive layer 100A, the gate dielectric layer the WFA layer 90A, the sidewall spacers 48, the first ESL 70 and the first ILD layer 75 are not substantially recessed, as shown in FIG. 12B.

Figure 13:
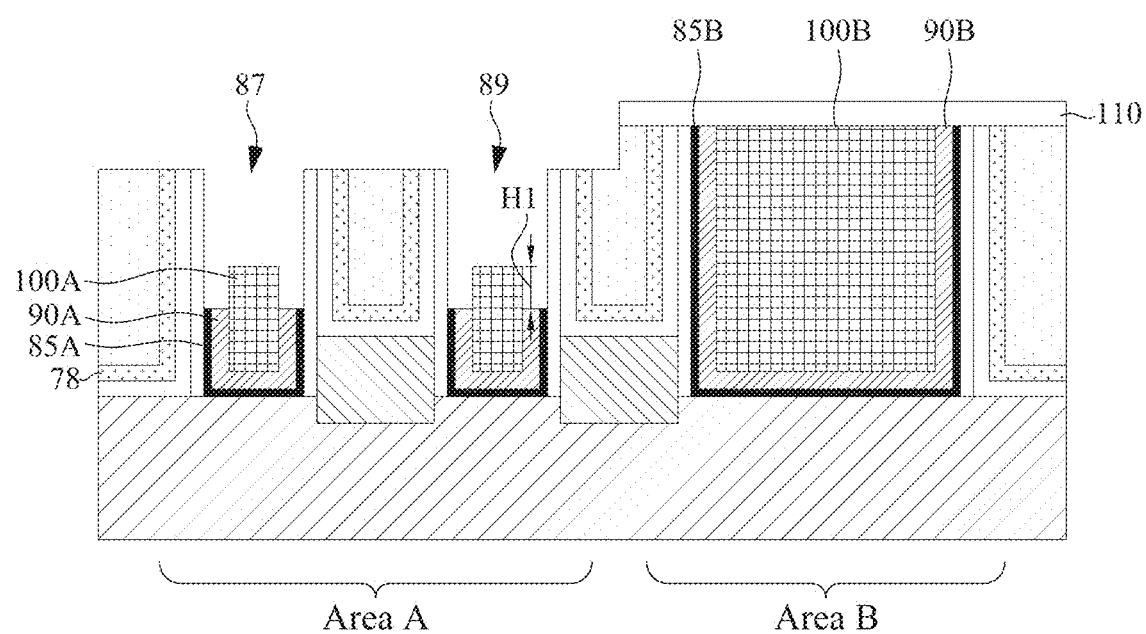

After the recess etching of Area A, the first conductive layers 100A and the WFA layers are recessed (etched-back) to form gate recesses 87 and 89, as shown in FIG. 13. Since the materials for the first conductive layers 100A and the WFA layer 90A are different, the etching amount (depth) of the first conductive layers 100A and the WFA layer 90A are different. For example, when the first conductive layers 100A is made of W and the WFA layer 90A are made of TiN or an aluminum-containing material (TiAl, TaAlC or Al), the WFA layer 90A are etched more than the first conductive layer 100A. As a result, the first conductive layer 100A protrudes from the WFA layer 90A, as shown in FIG. 13. The amount H1 of the protrusion is in a range from about 10 nm to about 50 nm in some embodiments. The gate dielectric layers 85A are also etched (recessed) by an additional etching operation. In other embodiments, the gate dielectric layers 85A are not etched (recessed).

Figure 14:
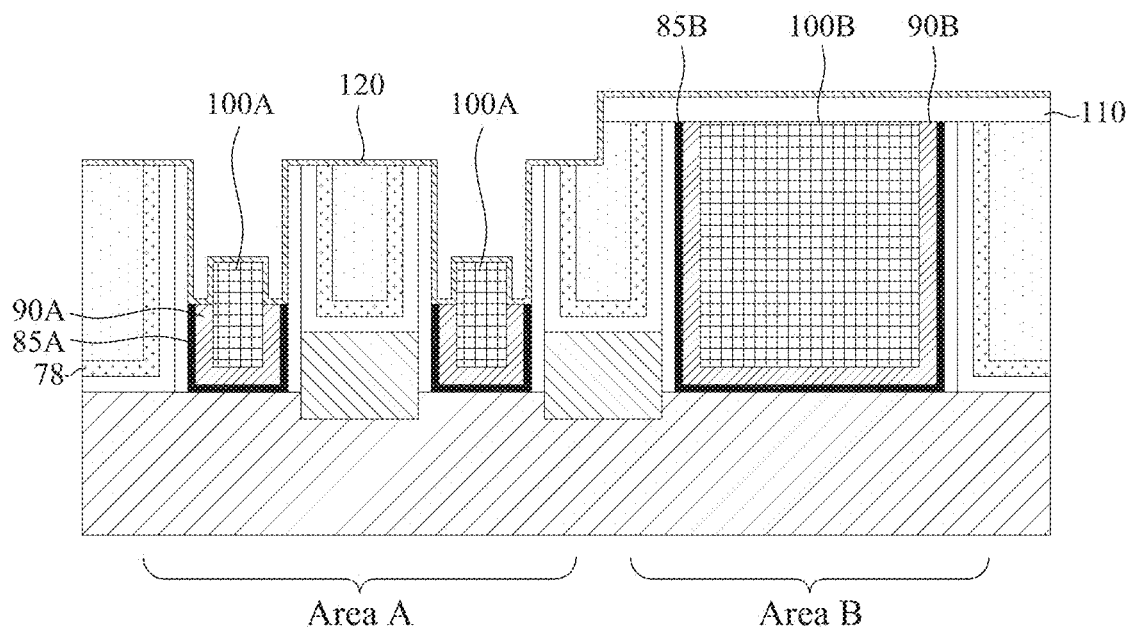
Figure 15:
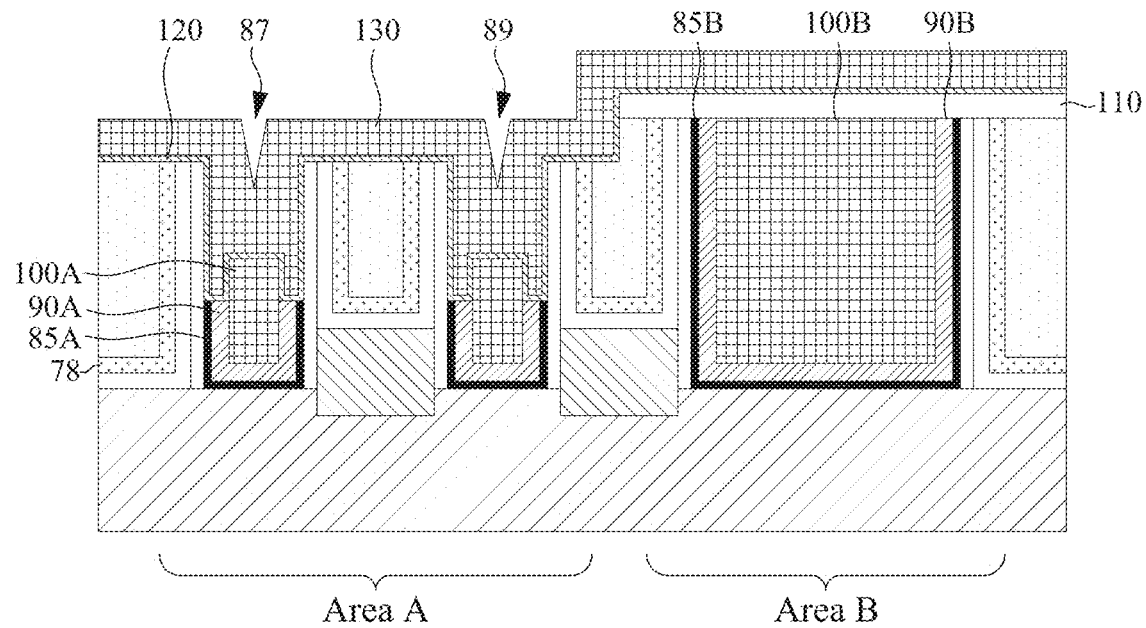

Then, as shown in FIG. 14, a blanket layer of a second metal material 120 is conformally formed over the structure of FIG. 13. Subsequently, a third metal material layer 130 is formed over the second metal material layer 120, as shown in FIG. 15. The third metal material layer 130 includes the one or more of Al, Co, Cu, W, Ti, Ta, TiN, TiAl, TiAlC, TiAlN, TaN, NiSi, CoSi, other conductive materials. In one embodiment, W, Co or Al is used. In this embodiment, the third metal material layer 130 is made of the same material as the first conductive layer 100. The second conductive layer 120 functions as a glue layer for the third conductive layer 130, and includes one or more layers of TiN, Ti or TaN. The second and third metal material is formed by CVD, PVD, ALD, electroplating or other suitable methods.

Figure 16:
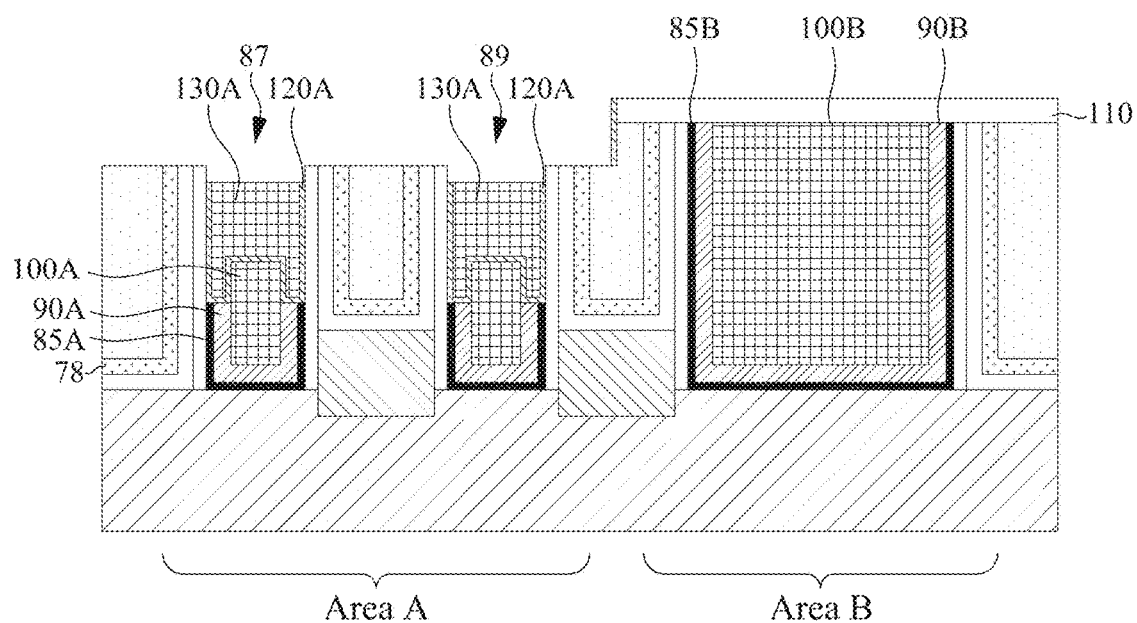

Subsequently, an etch-back operation is performed on the third conductive layer 130. By the etch-back operation, the third conductive layers 130A are formed in the gate recesses 87, 89 and the third conductive layer formed over Area B is removed, as shown in FIG. 16. In the etch-back operation, the second metal material 120 is also removed, thereby forming second conductive layers 120A.

Figure 17:
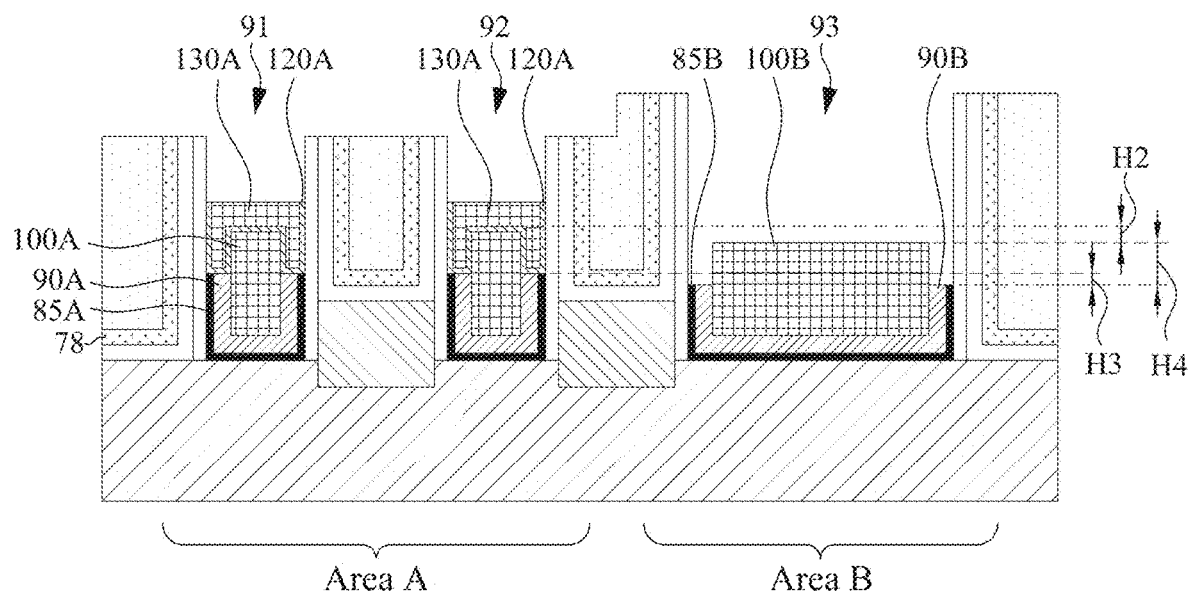

As shown in FIG. 17, the mask layer 110 is removed, and then an etch-back operation is again performed to recess the third conductive layers 130A in the first Area A, thereby forming first gate recesses 91, 92 and the first conductive layer 100B in the second Area B, thereby forming a second gate recess 93. In the etch-back operation, the gate dielectric layer 85B and the WFA layer 90B in the second area B are also recessed. In some embodiments, the gate dielectric layer 85B is not etched (recessed).

As shown in FIG. 17, the first conductive layer 100B protrudes from the WFA layer 90B by an amount of H4 since the materials for the first conductive layer 100B and the WFA layer are different, and the etching amount (depth) of the first conductive layers 100B and the WFA layer 90B are different. In some embodiments, H4 is less than about ±50 nm.

In some embodiments, a height of the recessed third conductive layer 130A measured from the substrate is different from a height of the recessed first conductive layer 100B by an amount of H2. In some embodiments, H2 is less than about ±60 nm. In some embodiments, the height of the recessed first conductive layer 100B is greater than the height of the recessed third conductive layer 130A, and in other embodiments, the height of the recessed first conductive layer 100B is smaller than the height of the recessed third conductive layer 130A.

Similarly, a height of the WFA layer 90A in Area A measured from the substrate is different from a height of the WFA layer 90B in Area B by an amount of H3. In some embodiments, H3 is less than about ±60 nm. In some embodiments, the height of the WFA layer is greater than the height of the height of the WFA layer 90B, and in other embodiments, the height of the WFA layer 90A is smaller than the height of the WFA layer 90B.

Figure 18:
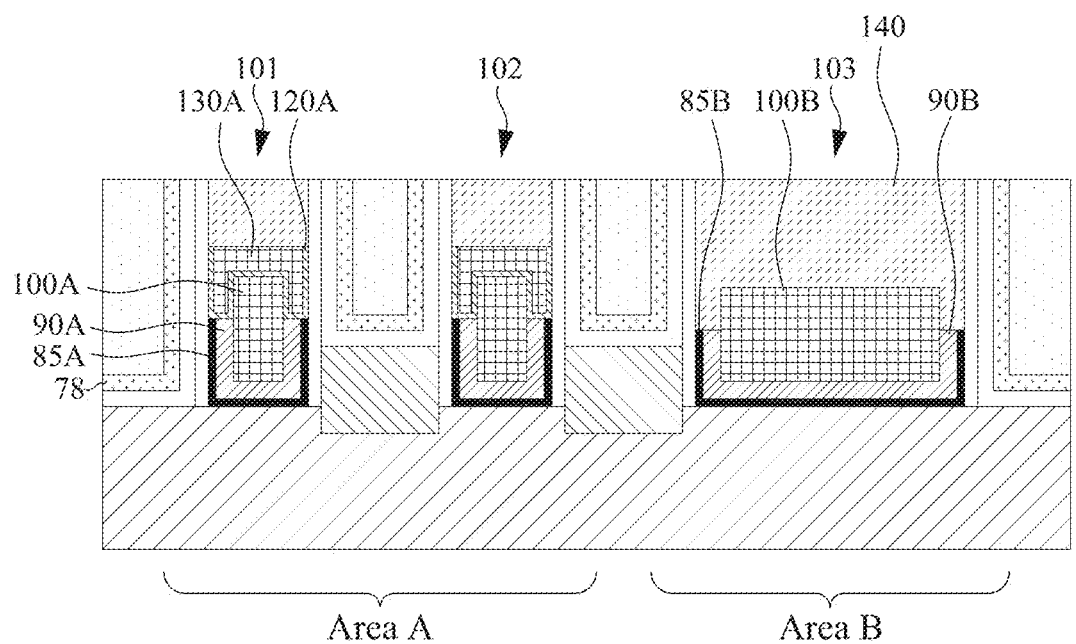

Further, as shown in FIG. 18, the gate recesses 91, 92 and 93 are filled by a second insulating layer 140. A blanket layer of a second insulating material is formed and a planarization operation, such as a CMP process, is performed. The second insulating layer 140 includes one or more layers of insulating material such as silicon nitride based material including SiN, SiCN and SiOCN.

As shown in FIG. 18, short channel FETs 101, 102 include a first gate dielectric layer and a first gate electrode. The first gate electrode includes a WFA layer 90A (underlying conductive layer) in contact with the first gate dielectric layer 85A and a first conductive layer 100A (bulk conductive layer). The first gate electrode further includes a third conductive layer 130A (upper conductive layer) and a second conductive layer 120A (intermediate conductive layer) disposed between the first conductive layer 100A and the third conductive layer 130A. The first conductive layer 100A protrudes from the WFA layer 90A. An insulating layer 140 is provided in contact with the third conductive layer 130A.

A long channel FET 103 includes a second gate dielectric layer 85B and a second gate electrode. The second gate electrode includes a WFA layer 90B in contact with the second gate dielectric layer 85B and a first conductive layer 100B. An insulating layer 140 is provided in contact with an upper surface of the WFA layer 90B and the first conductive layer 100B.

Figure 19:
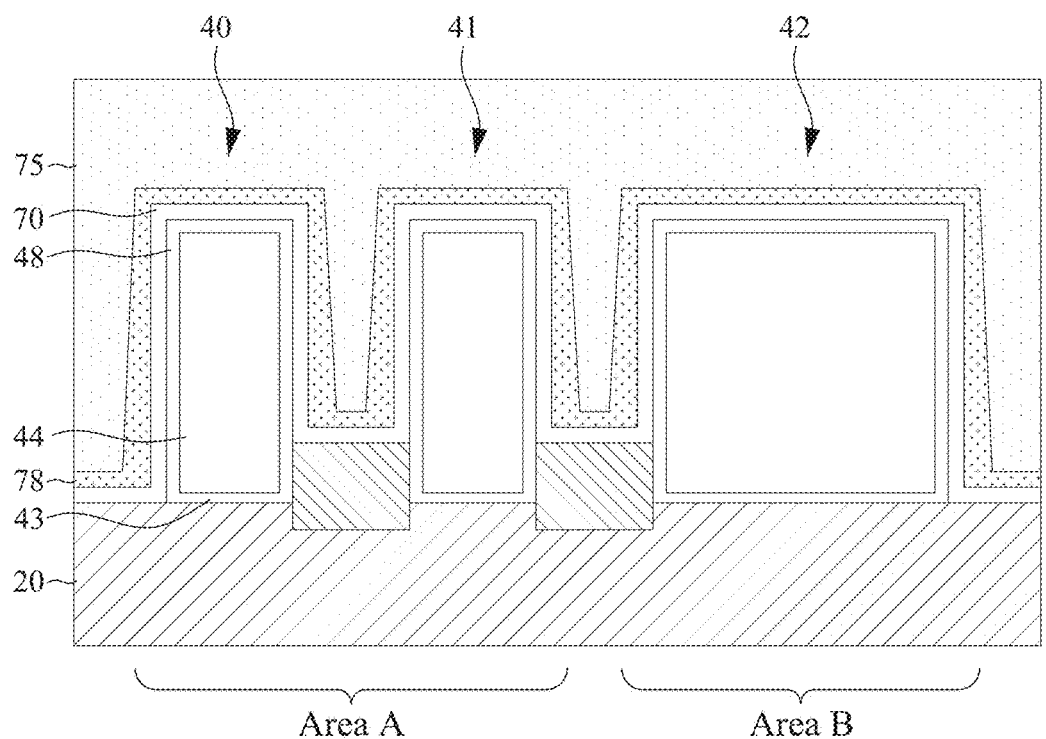
FIGS. 19, 20, and 21 show an exemplary sequential manufacturing process of a semiconductor device, according to embodiments of the present disclosure.

The thickness of the liner 78 in the embodiments discussed with reference to FIGS. 1A-5 and 8-18 is substantially uniform throughout. In other embodiments, the liner 78 is not uniformly thick and the liner 78 has a gradient profile. FIG. 19 illustrates the liner 78 composed of silicon oxide being relatively thicker near the bottom portions than the side and/or top portions thereof. In some embodiments, the thickness of the liner 78 varies between about 1 nm to about 5 nm. The liner 78 is deposited using plasma-enhanced chemical vapor deposition (PECVD) process in which the plasma power is modulated from about 15 W to about 1000 W. This deposits a V-shaped liner 78 that is relatively thicker at the bottom compared to the top. As a result, the ILD 75 is also has a V-shaped (or tapered) profile when deposited.

Figure 3B:
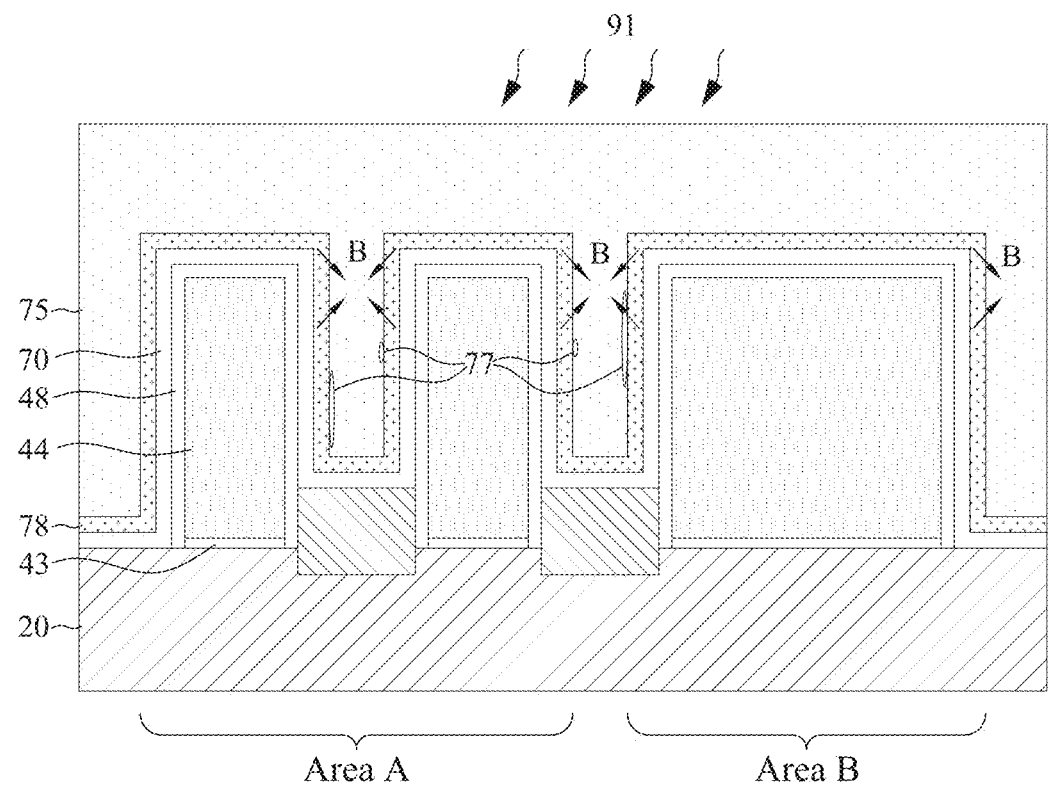

Subsequent annealing process, as discussed with reference to FIGS. 3A and 3B, creates a shrinkage gradient in the deposited ILD 75 from the top to the bottom of the dummy gate structures 40, 41 and 42. Stated otherwise, the annealing causes the ILD 75 at or adjacent the top portions to shrink (reduce in volume) relatively more than at or adjacent the bottom portions.

Figure 20:
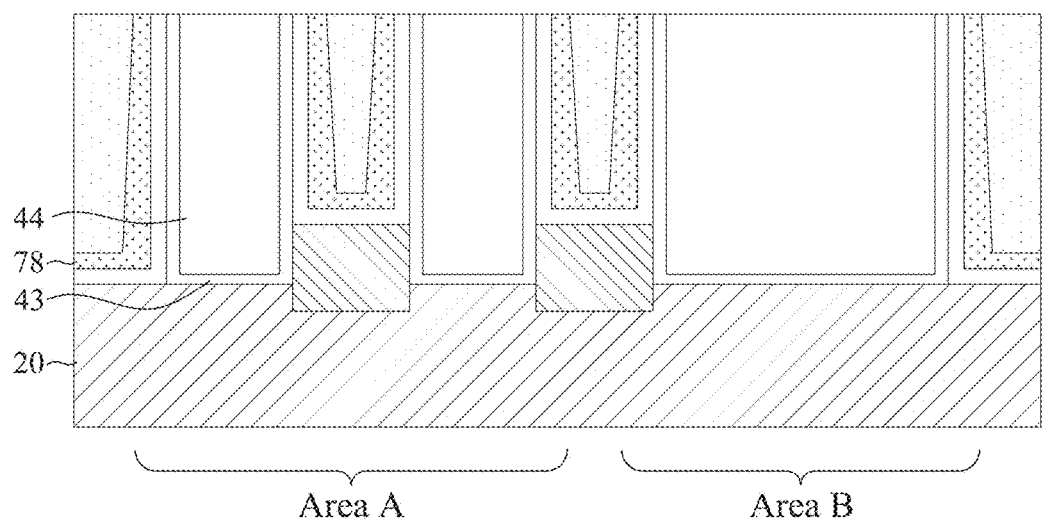

As illustrated in FIG. 20, a planarization operation, as discussed with reference to FIG. 4, is then performed on the structure illustrated in FIG. 19. The planarization operation may include a chemical mechanical polishing (CMP) and/or an etch-back process.

Figure 21:
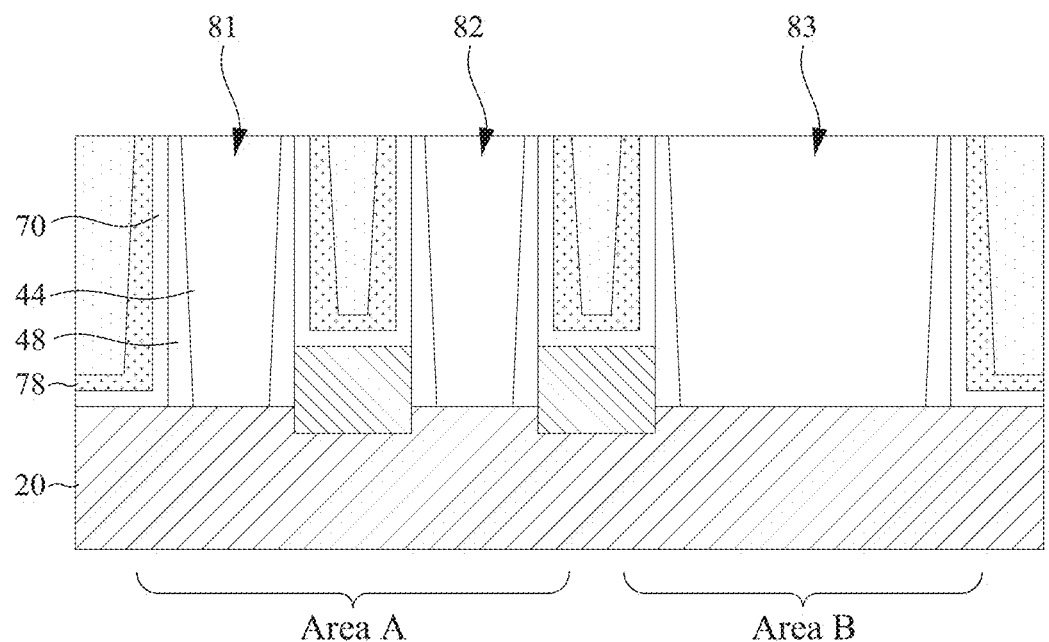

After the planarization operation, the dummy gate structures 40, 41 and 42 each including the dummy gate electrode layer 44 made of poly silicon and a dummy gate dielectric layer 43 are removed so as to make gate spaces 81, 82 and 83, as shown in FIG. 21 (similar to the operation in FIG. 5). Removing the dummy gate electrode layer 44 relieves the stresses and, as illustrated, creates gate spaces 81, 82 and 83 having a funnel (or V-shaped) profile with a higher gate CD at or adjacent the top as compared at or adjacent the bottom. Such a V-shaped profile more effectively fills the gaps and voids formed by the ILD shrinkage.

It is understood that the devices shown in FIGS. 18 and 21 undergo further CMOS processes to form various features such as contacts/vias, interconnect conductive layers, dielectric layers, passivation layers, etc. In the above embodiment, the manufacturing operations for a Fin FET are described. However, the above manufacturing process may be applied to other types of FET, such as a planar type FET, nanosheet, gate-all-around GAA FET having all side surfaces of the channel region surrounded by a gate electrode, and the like.

FIGS. 22A to 29B show various stages of manufacturing a metal gate structure of a GAA FET device using nanowires or nanosheets according to an embodiment of the present disclosure. It is understood that additional operations can be provided before, during, and after processes shown by FIGS. 22A-29B, and some of the operations described below can be replaced or eliminated, for additional embodiments of the method. The order of the operations/processes may be interchangeable.

Figure 22A:
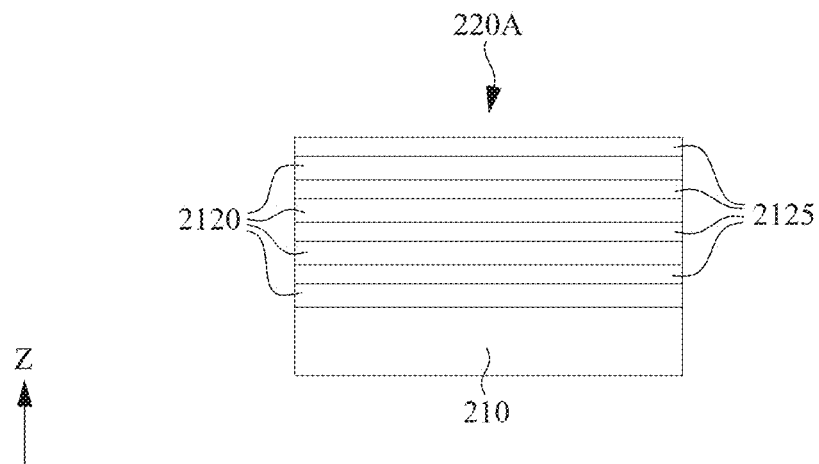
FIGS. 22A and 22B show various stages of a sequential process for manufacturing a semiconductor device according to an embodiment of the present disclosure.

As shown in FIG. 22A, one or more fin structures 220A including first semiconductor layers 2120 and second semiconductor layers 2125 alternately formed over a bottom fin structure 211 disposed on the substrate 210 are formed. The first semiconductor layers 2120 and the second semiconductor layers 2125 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 2120 and the second semiconductor layers 2125 are made of Si, a Si compound, SiGe, Ge or a Ge compound. In some embodiments, the first semiconductor layers 2120 are $Si_{1-x}Ge_x$, where x is equal to or more than about 0.1 and equal to or less than about 0.6, and the second semiconductor layers 2125 are Si or $Si_{1-y}Ge_y$, where y is smaller than x and equal to or less than about 0.2. In this disclosure, an "M" compound" or an "M based compound" means the majority of the compound is M.

Figure 22B:
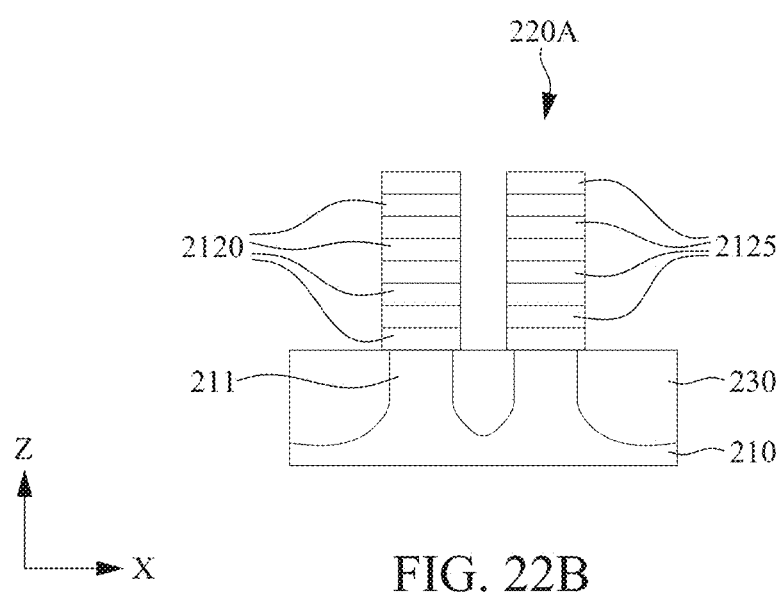

The first semiconductor layers 2120 and the second semiconductor layers 2125 are epitaxially formed over the substrate 210. The thickness of the first semiconductor layers 2120 may be equal to or greater than that of the second semiconductor layers 2125, and is in a range from about 5 nm to about 60 nm in some embodiments, and is in a range from about 10 nm to about 30 nm in other embodiments. The thickness of the second semiconductor layers 2125 is in a range from about 5 nm to about 60 nm in some embodiments, and is in a range from about 10 nm to about 30 nm in other embodiments. The thickness of the first semiconductor layers 2120 may be the same as, or different from the thickness of the second semiconductor layers 2125. Although four first semiconductor layers 2120 and four second semiconductor layers 2125 are shown in FIGS. 22A and 22B, the numbers are not limited to four, and can be 1, 2, 3 or more than 4, and is less than 20. In some embodiments, the number of the first semiconductor layers 2120 is greater by one than the number of the second semiconductor layers 2125 (i.e.—the top layer is the first semiconductor layer).

After the stacked semiconductor layers are formed, fin structures 220A are formed by using one or more lithography and etching operations, as shown in FIGS. 22A and 22B. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIGS. 22A and 22B, the fin structures 220A extend in the X direction and are arranged in the Y direction. The number of the fin structures 220A is not limited to two, and may be as small as one and three or more. In some embodiments, one or more dummy fin structures are formed on both sides of the fin structures 220A to improve pattern fidelity in the patterning operations. The fin structures 220A have upper portions constituted by the stacked semiconductor layers. The width of the upper portion of the fin structure 220A along the Y direction is in a range from about 10 nm to about 40 nm in some embodiments, and is in a range from about 20 nm to about 30 nm in other embodiments.

After the fin structures 220A are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 2125 is exposed from the insulating material layer. In some embodiments, one or more fin liner layers are formed over the fin structures before forming the insulating material layer. In some embodiments, the fin liner layers include a first fin liner layer formed over the substrate 210 and sidewalls of the bottom part of the fin structures 211, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 22B, the insulating material layer is recessed to form an isolation insulating layer 230 so that the upper portions of the fin structures 220A are exposed. With this operation, the fin structures 220A are separated from each other by the isolation insulating layer 230, which is also called a shallow trench isolation (STI). The isolation insulating layer 230 may be made of suitable dielectric materials, such as silicon oxide, silicon nitride, silicon oxynitride, fluorine-doped silicate glass (FSG); low-k dielectrics, such as carbon doped oxides; extremely low-k dielectrics, such as porous carbon doped silicon dioxide; a polymer, such as a polyimide; combinations of these; or the like. In some embodiments, the isolation insulating layer 230 is formed through a process such as CVD, flowable CVD (FCVD), or a spin-on-glass process, although any acceptable process may be utilized.

Figure 23A:
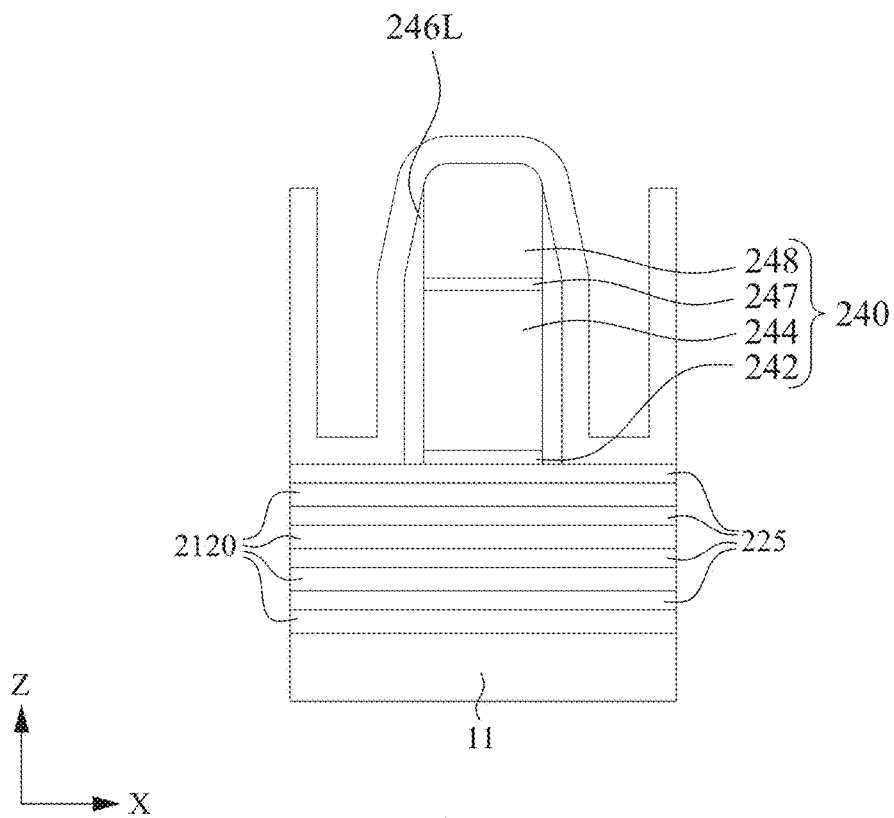
FIGS. 23A and 23B show various stages of a sequential process for manufacturing a semiconductor device according to an embodiment of the present disclosure.
Figure 23B:
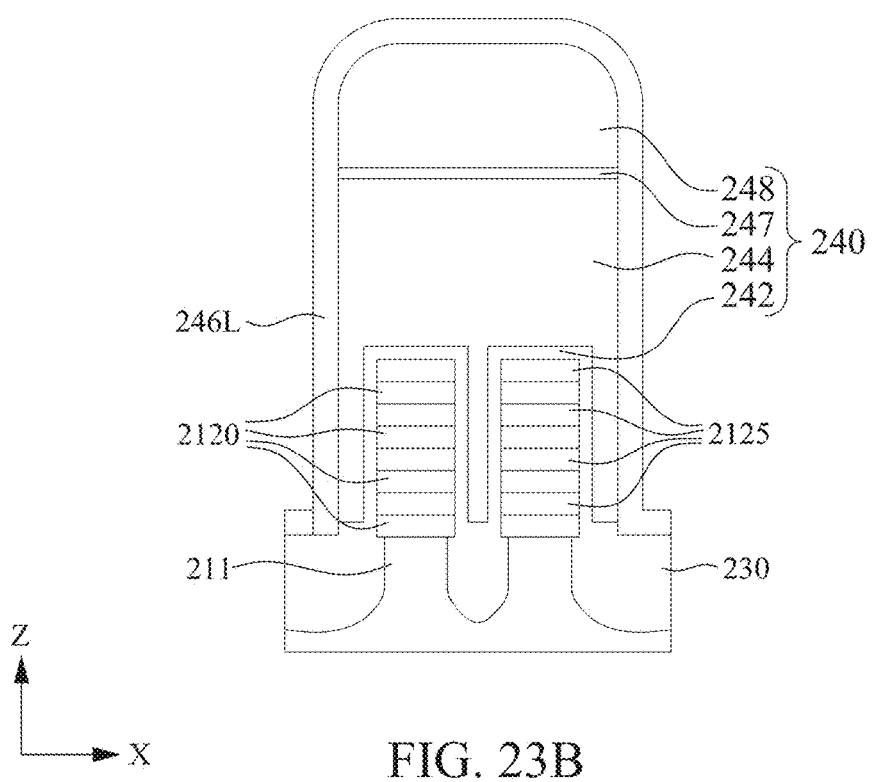

After the isolation insulating layer 230 is formed, a sacrificial (dummy) gate structure 240 is formed, as shown in FIGS. 23A and 23B. FIGS. 23A and 23B illustrate a structure after a sacrificial gate structure 240 is formed over the exposed fin structures. The sacrificial gate structure 240 is formed over a portion of the fin structures which is to be a channel region. The sacrificial gate structure 240 defines the channel region of the GAA FET. The sacrificial gate structure 240 includes a sacrificial gate dielectric layer 242 and a sacrificial gate electrode layer 244. The sacrificial gate dielectric layer 242 includes one or more layers of insulating material, such as a silicon oxide-based material. In one embodiment, silicon oxide formed by CVD is used. The thickness of the sacrificial gate dielectric layer 242 is in a range from about 1 nm to about 5 nm in some embodiments.

The sacrificial gate structure 240 is formed by first blanket depositing the sacrificial gate dielectric layer 242 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon, such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 247 and a silicon oxide mask layer 248.

Next, a patterning operation is performed on the mask layer and sacrificial gate electrode layer is patterned into the sacrificial gate structure 240, as shown in FIGS. 23A and 23B. The sacrificial gate structure includes the sacrificial gate dielectric layer 242, the sacrificial gate electrode layer 244 (e.g., poly silicon), the pad silicon nitride layer 247 and the silicon oxide mask layer 248. By patterning the sacrificial gate structure, the stacked layers of the first and second semiconductor layers are partially exposed on opposite sides of the sacrificial gate structure, thereby defining source/drain regions, as shown in FIGS. 23A and 23B. In this disclosure, a source and a drain are interchangeably used and the structures thereof are substantially the same. In FIGS. 23A and 23B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 246L for sidewall spacers is formed over the sacrificial gate structure 240, as shown in FIGS. 23A and 23B. The first cover layer 246L is deposited in a conformal manner so that it is formed to have substantially equal thicknesses on vertical surfaces, such as the sidewalls, horizontal surfaces, and the top of the sacrificial gate structure, respectively. In some embodiments, the first cover layer 246L has a thickness in a range from about 5 nm to about 20 nm. The first cover layer 246L includes one or more of silicon nitride, SiON, SiCN, SiCO, SiOCN or any other suitable dielectric material. The cover layer 246L can be formed by ALD or CVD, or any other suitable method. Then, the first cover layer 246L is anisotropicaly etched to remove the first cover layer 246L disposed on the source/drain region, while leaving the first cover layer as sidewall spacers 246 (see, FIG. 24A) on side faces of the sacrificial gate structure 240.

Figure 24A:
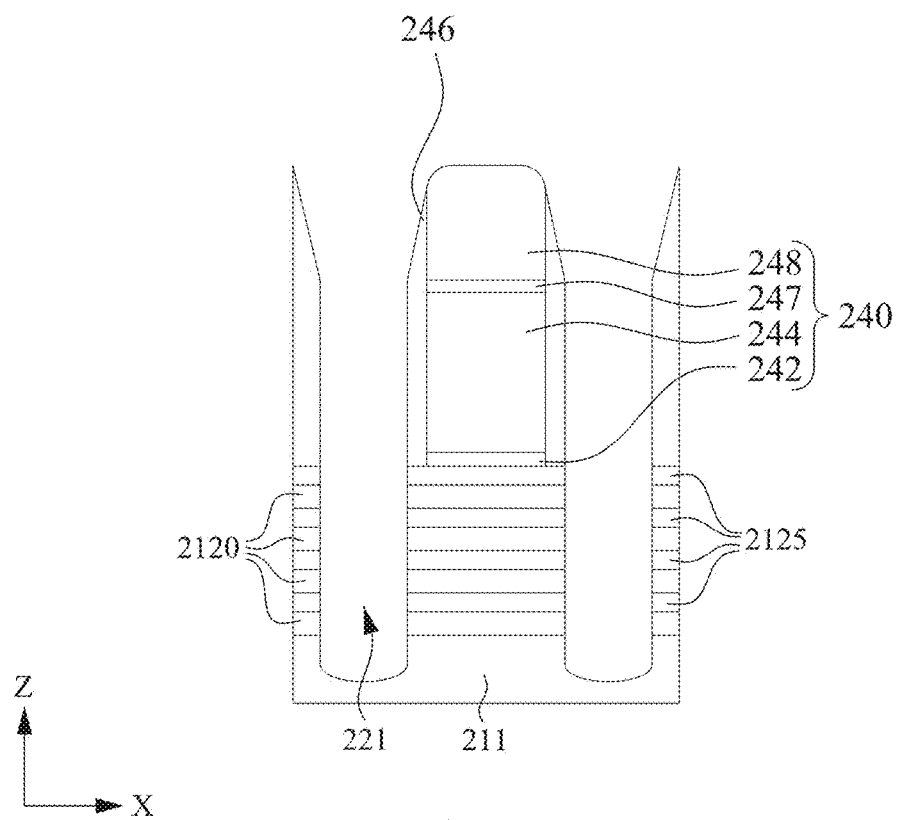
FIGS. 24A and 24B show various stages of a sequential process for manufacturing a semiconductor device according to an embodiment of the present disclosure.

Then the stacked structure of the first semiconductor layers 2120 and the second semiconductor layer 2125 is etched down at the source/drain region, by using one or more lithography and etching operations, thereby forming a source/drain space 221, as shown in FIG. 24A. In some embodiments, the substrate 210 (or the bottom part of the fin structures 211) is also partially etched. In some embodiments, an n-type FET and a p-type FET are manufactured separately, and in such a case, a region for one type of FET is processed, and a region for the other type of FET is covered by a protective layer, such as a silicon nitride. In some embodiments, as shown in FIG. 24A, the recessed fin structure has a U-shape. In other embodiments, the recessed fin structure has a V-shape showing (111) facets of silicon crystal. In other embodiments, the recess has a reverse trapezoid shape, or a rectangular shape. In some embodiments, the recess is formed by a dry etching process, which may be anisotropic. The anisotropic etching process may be performed using a process gas mixture including $BF_2$, $Cl_2$, $CH_3F$, $CH_4$, HBr, $O_2$, Ar, other etchant gases. The plasma is a remote plasma that is generated in a separate plasma generation chamber connected to the processing chamber in some embodiments.

Figure 24B:
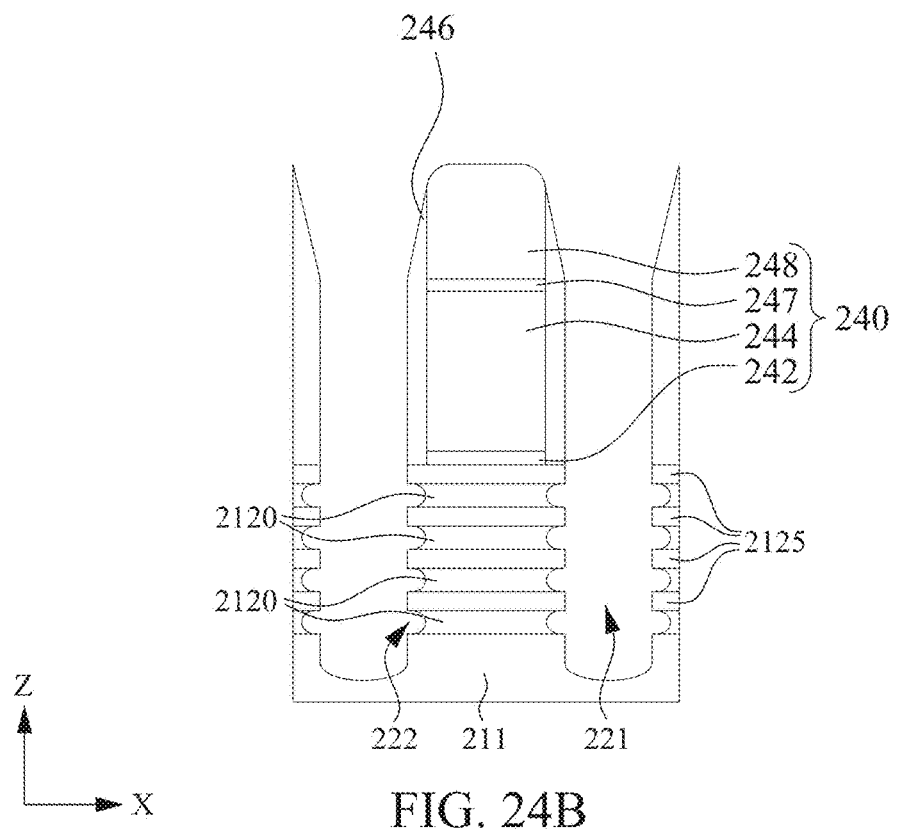

Further, as shown in FIG. 24B, the first semiconductor layers 2120 are laterally etched in the X direction within the source/drain space 221, thereby forming cavities 222. When the first semiconductor layers 2120 are SiGe and the second semiconductor layers 2125 are Si, the first semiconductor layers 2120 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

Figure 25A:
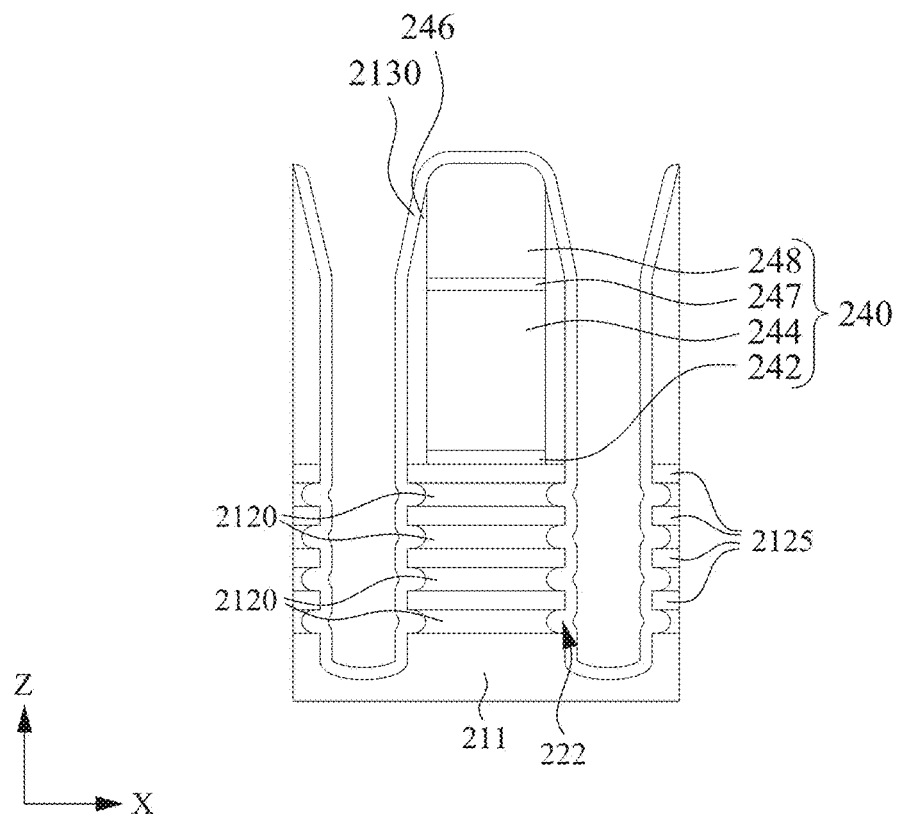
FIGS. 25A and 25B show various stages of a sequential process for manufacturing a semiconductor device according to an embodiment of the present disclosure.

Next, as shown in FIG. 25A, a first insulating layer 2130 is conformally formed on the etched lateral ends of the first semiconductor layers 2120 and on end faces of the second semiconductor layers 2125 in the source/drain space 221 and over the sacrificial gate structure 240. The first insulating layer 2130 includes one of silicon nitride and silicon oxide, SiON, SiOC, SiCN and SiOCN, or any other suitable dielectric material. The first insulating layer 2130 is made of a different material than the sidewall spacers (first cover layer) 246. The first insulating layer 230 has a thickness in a range from about 1.0 nm to about 10.0 nm in some embodiments. In other embodiments, the first insulating layer 2130 has a thickness in a range from about 2.0 nm to about 5.0 nm. The first insulating layer 2130 can be formed by ALD or any other suitable methods. By conformally forming the first insulating layer 2130, the cavities 222 are fully filled with the first insulating layer 2130.

Figure 25B:
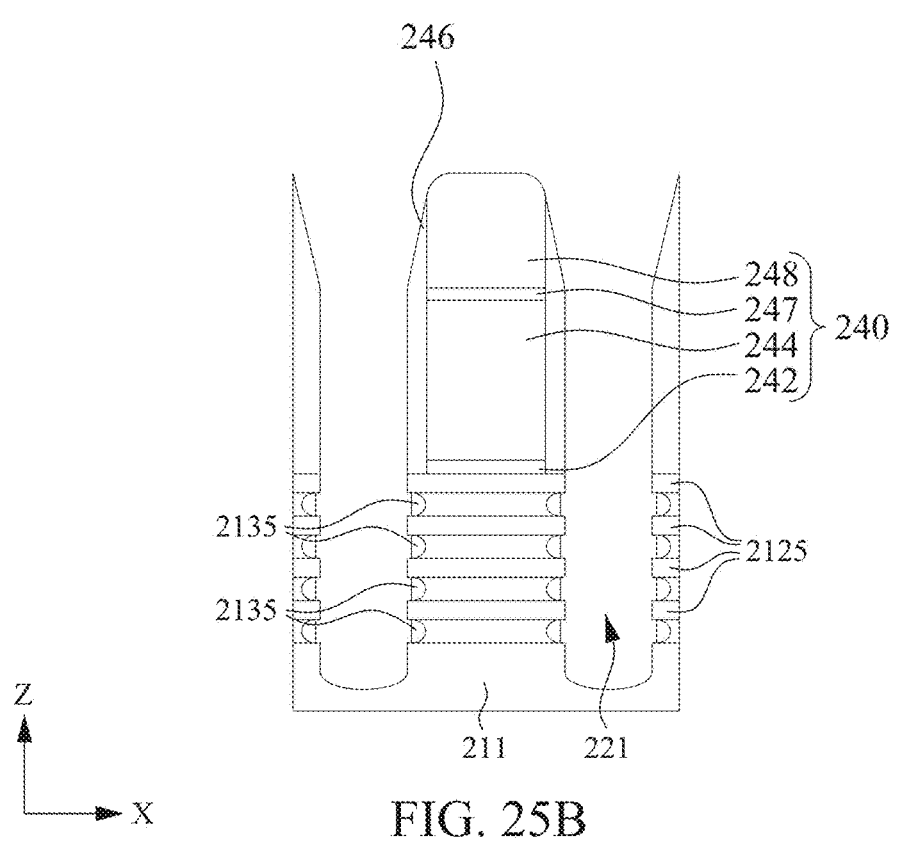

After the first insulating layer 2130 is formed, an etching operation is performed to partially remove the first insulating layer 2130, thereby forming inner spacers 2135, as shown in FIG. 25B. In some embodiments, the end face of the inner spacers 2135 is recessed more than the end face of the second semiconductor layers 2125. The recessed amount is in a range from about 0.2 nm to about 3 nm and is in a range from about 0.5 nm to about 2 nm in other embodiments. In other embodiments, the recessed amount is less than 0.5 nm and may be equal to zero (i.e.—the end face of the inner spacer 2135 and the end face of the second semiconductor layers 2125 are flush with each other).

Figure 26A:
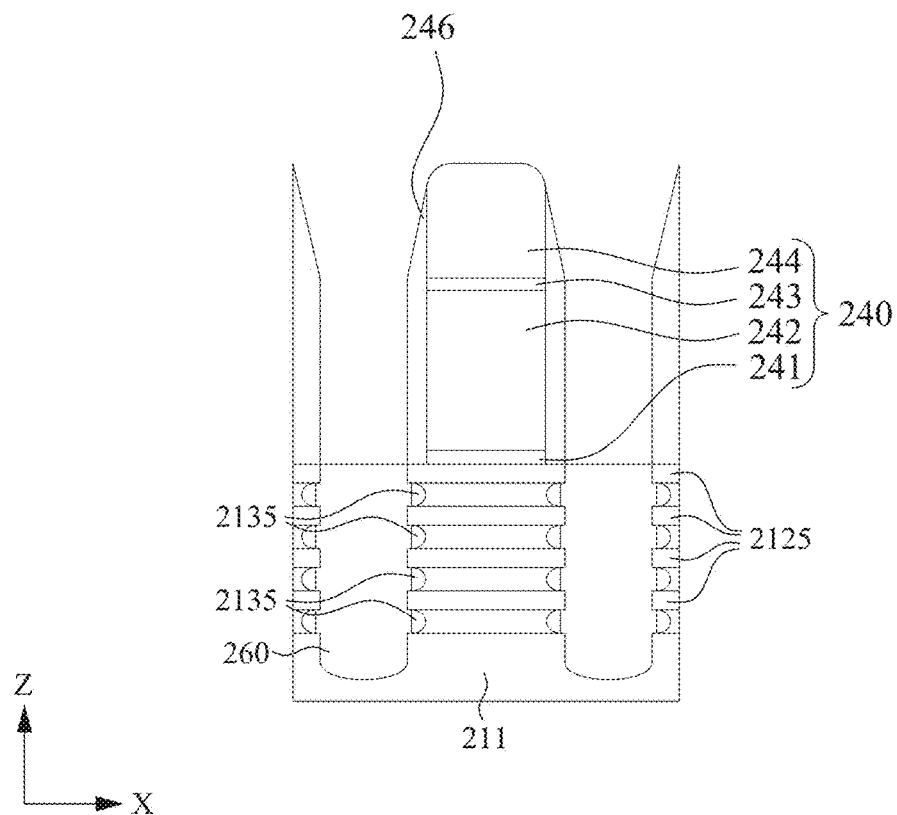
FIGS. 26A and 26B show various stages of a sequential process for manufacturing a semiconductor device according to an embodiment of the present disclosure.

Subsequently, as shown in FIG. 26A, one or more source/drain epitaxial layers 260 are formed on the recessed fin structure 211 at the bottom of the source/drain space 221. In some embodiments, the source/drain epitaxial layer 260 includes a non-doped Si or non-doped SiGe, a doped Si, a doped SiGe or a doped Ge. In some embodiments, the dopant is C, P, As, B, and/or In.

Figure 26B:
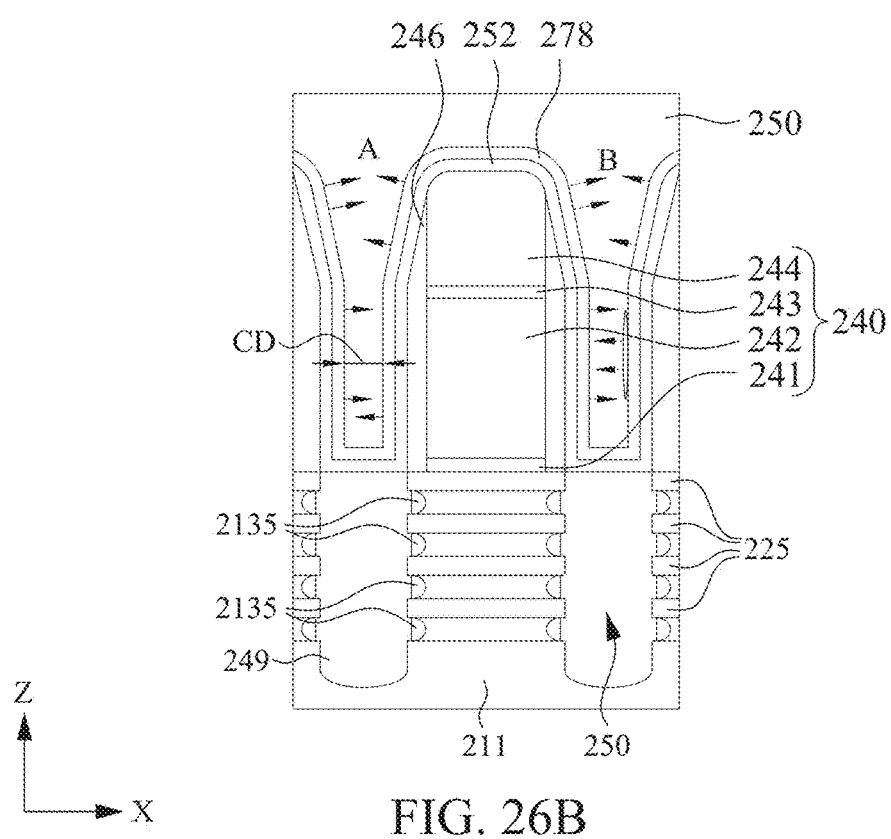

Then, as shown in FIG. 26B, an etch stop layer 252 is formed. The etch stop layer 252 includes one of silicon nitride and silicon oxide, SiON, SiOC, SiCN and SiOCN, or any other suitable dielectric material. The etch stop layer 252 is made of a different material than the sidewall spacers (first cover layer) 246. The etch stop layer 252 can be formed by ALD or any other suitable methods. A liner 278 is then formed on the etch stop layer 252. The liner 278 includes one or more layers of material including silicon (Si), such as polysilicon or amorphous silicon. In some other embodiments, the liner 278 includes one or more layers of material including $SiO_2$ or SiOCN. The thickness of the liner 278 is in a range from about 1 nm (10 Å) to about 5 nm (50 Å) in some embodiments. The liner 278 is similar to the liner 78 discussed above and a detailed explanation of the liner 278 is omitted for the sake of brevity.

Next, a first interlayer dielectric (ILD) layer 250 is formed over the liner 278. The first interlayer dielectric (ILD) layer 250 includes one or more layers of insulating material such as silicon oxide based material such as silicon dioxide ($SiO_2$) or SiON An annealing process is then performed. In some embodiments, the annealing process includes a steam annealing process in which the first interlayer dielectric (ILD) layer 250 is exposed to superheated steam. The superheated steam is provided having a temperature from about 450° C. to about 550° C. and a pressure from about 40 barG (gauge pressure) to about 110 barG, in some embodiments. However, other types of thermal processes can also be used.

The annealing process causes the volume of the liner 278 to increase (e.g., liner 278 expands), generally indicated by the arrows A in FIG. 26B. In some embodiments, annealing process includes a wet anneal process in which the first interlayer dielectric (ILD) layer 250 is exposed to steam at a temperature in a range from about 200° C. to about 700° C. for a period in a range from about 30 min to about 120 min. The expansion reduces the gate critical dimension (CD) between the adjacent dummy gate structures 240, 41 and 42. A desired gate CD can be obtained by controlling an amount by which the liner 278 expands.

The annealing (or other thermal) processes can cause the dimensions of the first ILD layer 250 to change. For instance, the first ILD layer 250 may reduce in volume (e.g., shrink) and thereby separate from the liner 278, as generally indicated by the arrows B in FIG. 3B. As a result, gaps (or voids) 277 may be formed between the first ILD layer 250 and the liner 278. The shrinkage of the first ILD layer 250 and the resulting gaps 277 cause a change in the gate CD that this can adversely affect the performance (e.g., electrical properties) of the semiconductor device. However, as discussed above the annealing process coverts the Si liner 278 into oxide by oxygen contained in the first ILD layer 250, and this causes the volume of the liner 278 to increase. The liner 278 occupies the gaps 277 when expanding, and thereby the volume of the gaps 277 is reduced. Thus, the gaps 277 are reduced and any change in the gate CD is minimized.

Figure 27A:
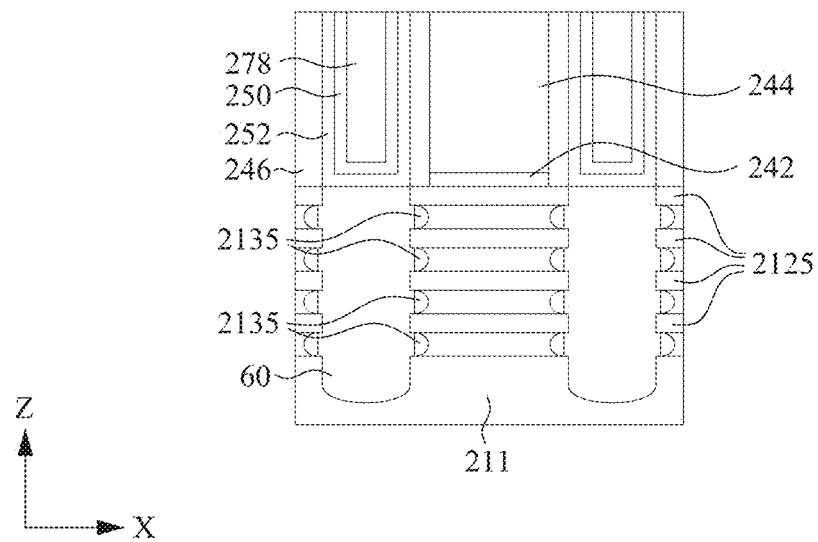
FIGS. 27A and 27B show various stages of a sequential process for manufacturing a semiconductor device according to an embodiment of the present disclosure.

After the ILD layer 250 is formed, a planarization operation, such as CMP, is performed, so that the top portion of the sacrificial gate electrode layer 244 is exposed, as shown in FIG. 27A. Then, the sacrificial gate electrode layer 244 and sacrificial gate dielectric layer 242 are removed. The ILD layer 250 protects the source/drain epitaxial layers 260 during the removal of the sacrificial gate structures. The sacrificial gate structures can be removed using plasma dry etching and/or wet etching. When the sacrificial gate electrode layer 244 is polysilicon and the ILD layer 250 is silicon oxide, a wet etchant such as a TMAH solution can be used to selectively remove the sacrificial gate electrode layer 244. The sacrificial gate dielectric layer 242 is thereafter removed using plasma dry etching and/or wet etching.

Figure 27B:
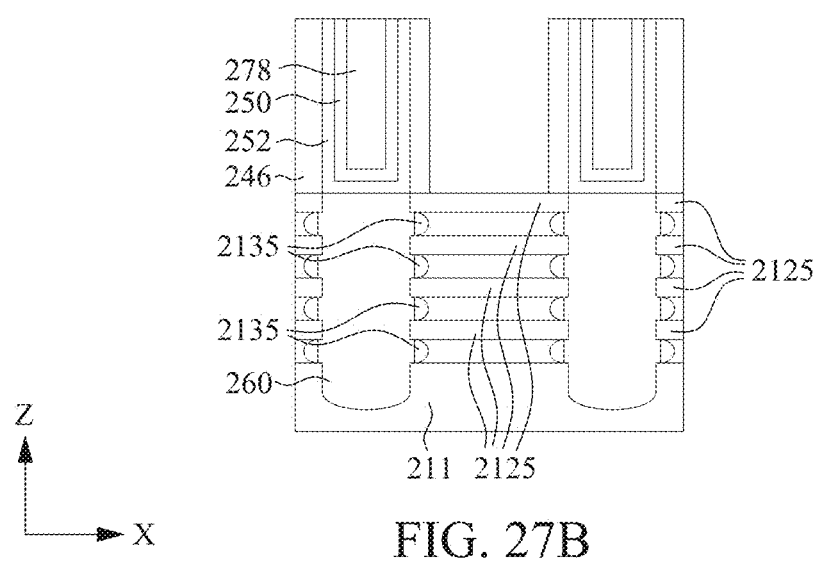

After the sacrificial gate structures are removed, the first semiconductor layers 2120 are removed, thereby forming wires or sheets (channel regions) of the second semiconductor layers 2125, as shown in FIG. 27B. The first semiconductor layers 2120 can be removed or etched using an etchant that can selectively etch the first semiconductor layers 2120 against the second semiconductor layers 2125, as set forth above. Since the first insulating layers (inner spacers) 2135 are formed, the etching of the first semiconductor layers 2120 stops at the first insulating layer 2135. In other words, the first insulating layer 2135 functions as an etch-stop layer for etching of the first semiconductor layers 2120.

Figure 28A:
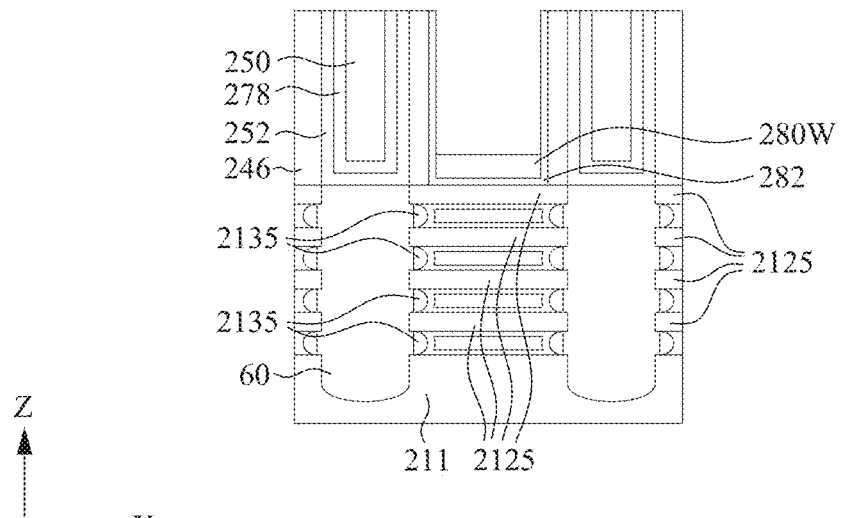
FIGS. 28A and 28B show various stages of a sequential process for manufacturing a semiconductor device according to an embodiment of the present disclosure.

After the semiconductor wires or sheets (channel regions) of the second semiconductor layers 2125 are formed, a gate dielectric layer 282 is formed around each of the channel regions, as shown in FIG. 28A. In some embodiments, the gate dielectric layer 282 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 282 includes an interfacial layer (not shown) formed between the channel layers and the dielectric material. The gate dielectric layer 282 may be formed by CVD, ALD or any suitable method. In one embodiment, the gate dielectric layer 282 is formed using a highly conformal deposition process, such as ALD, in order to ensure the formation of a gate dielectric layer having a uniform thickness around each channel layers. The thickness of the gate dielectric layer 282 is in a range from about 1 nm to about 6 nm in one embodiment.

In some embodiments, one or more work function adjustment layers 280W are formed over the gate dielectric layer 282, as shown in FIG. 28A. The work function adjustment layers 280W are made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, one or more of TiAlC, Al, TiAl, TaN, TaAlC, TiN, TiC and Co are used as the work function adjustment layer for the p-channel FET. For an n-channel FET, one or more of TaN, TaAlC, TiN, TiC, Co, TiAl, HfTi, TiSi and TaSi is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 28B:
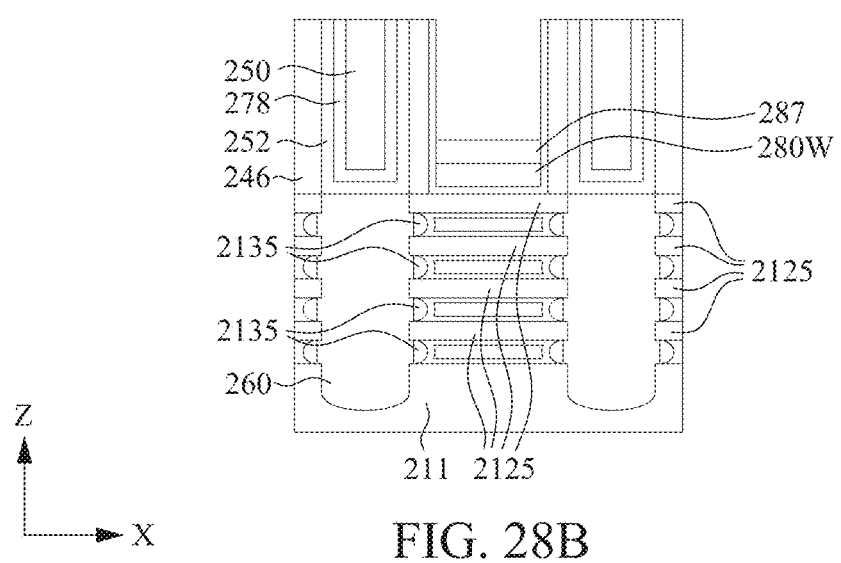

Then, as shown in FIG. 28B, a cap metal layer 287 formed as over the one or more work function adjustment layers 280W. The cap metal layer 287 includes W, Ta, Sn, Nb, Ru, Co or Mo. In some embodiments, the cap metal layer 287 is formed by an ALD process using metal halide (chloride) gases (e.g., $TaCl_5$, $SnCl_4$, $NbCl_5$ or $MoCl_4$). In some embodiments, the cap metal layer 287 includes a fluorine-free metal, for example, fluorine-free W formed by $WCl_5$ as a source gas. In some embodiments, a second cap metal layer similar to one of the first, second and third conductive layers is formed over the cap metal layer 287.

Figure 29A:
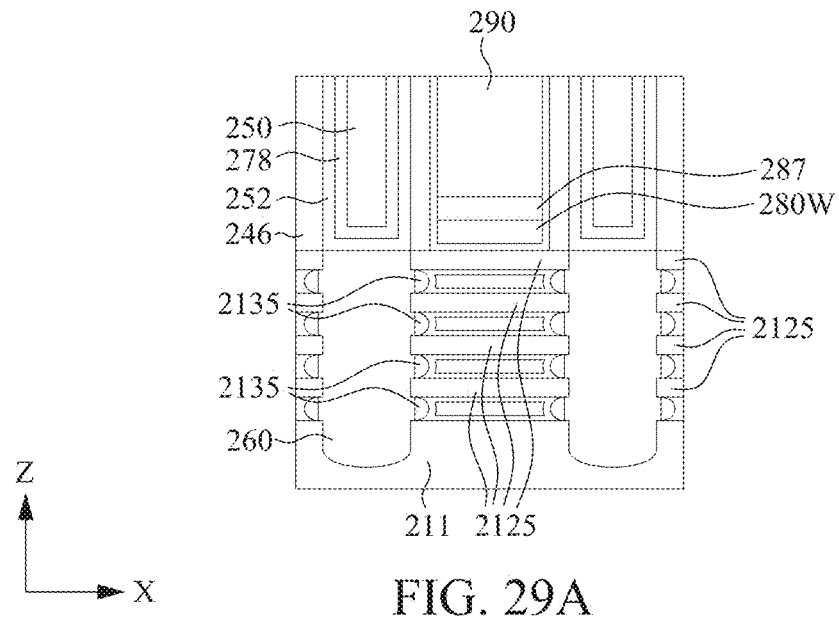
FIGS. 29A and 29B show various stages of a sequential process for manufacturing a semiconductor device according to an embodiment of the present disclosure.

Further, as shown in FIG. 29A, a gate cap insulating layer 290 is formed over the cap metal layer 287. In some embodiments, the gate cap insulating layer 290 includes silicon nitride, SiON and/or SiOCN or any other suitable material.

Figure 29B:
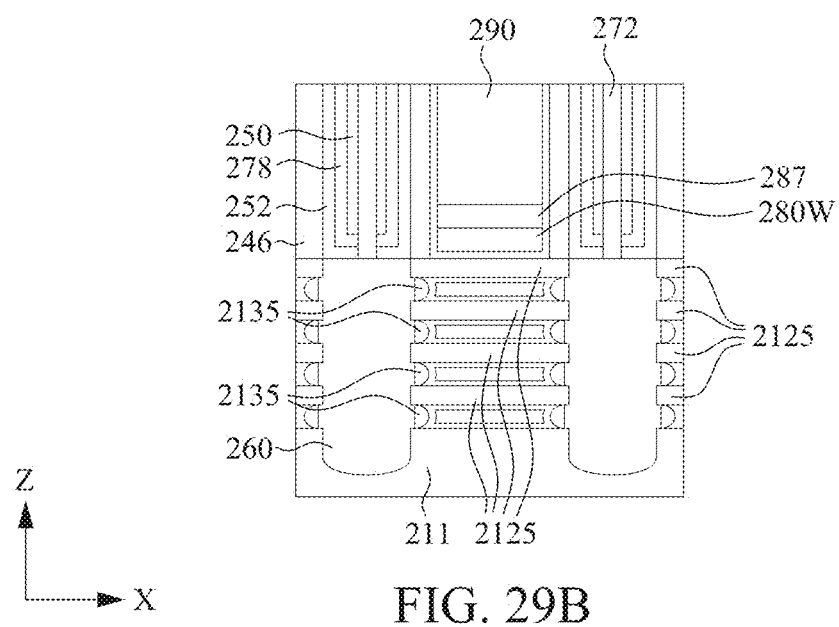

Subsequently, contact holes are formed in the ILD layer 250 and the etch stop layer 252 by using dry etching, thereby exposing the upper portion of the source/drain epitaxial layer 260. In some embodiments, a silicide layer is formed over the source/drain epitaxial layer 260. The silicide layer includes one or more of WSi, CoSi, NiSi, TiSi, MoSi and TaSi. Then, a conductive contact layer 272 is formed in the contact holes as shown in FIG. 29B. The conductive contact layer 272 includes one or more of Co, Ni, W, Ti, Ta, Cu, Al, TiN and TaN.

It is understood that the GAA FETs undergo further CMOS processes to form various features such as contacts/vias, interconnect metal layers, dielectric layers, passivation layers, etc.

The various embodiments or examples described herein offer several advantages over the existing art. For example, in the present disclosure, the liner fills the gaps due to ILD shrinkage and improves the electrical performance of the semiconductor device.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device includes forming a dummy gate structure over a substrate, the dummy gate structure includes including a dummy gate dielectric layer and a dummy gate electrode layer; forming sidewall spacers including one or more layers of insulating materials on sidewalls of the dummy gate structure; forming a silicon based liner over the sidewall spacers; forming a first insulating layer over the silicon based liner; thermally treating the silicon based liner and the first insulating layer, and thereby causing a reduction in a volume of the first insulating layer and an increase in a volume of the silicon based liner; removing the dummy gate structure to form a gate space in the first insulating layer; and filling the gate space with a high-k dielectric layer and a first conductive layer. The dummy gate electrode has a width Wg and the gate space has a width Ws at or adjacent a top of the dummy gate structure, and the width Ws is smaller than Wg. In one or more of the foregoing and following embodiments, the reduction in the volume of the first insulating layer causes the first insulating layer to separate from the silicon based liner and thereby form a gap between the first insulating layer and the silicon based liner. In one or more of the foregoing and following embodiments, the increase in the volume of the silicon based liner decreases the gap between the first insulating layer and the silicon based liner. In one or more of the foregoing and following embodiments, removing the dummy gate structure includes removing the dummy gate electrode layer to reduce stresses generated from the increase in the volume of the silicon based liner, wherein the reduction in the stresses causes the silicon based liner to occupy the gap. In one or more of the foregoing and following embodiments, the silicon based liner includes silicon and thermally treating the silicon based liner converts the silicon based liner into silicon oxide. In one or more of the foregoing and following embodiments, before forming the first insulating layer and the silicon based liner, the method includes forming a first etching stop layer (ESL) over the dummy gate structure, wherein the silicon based liner is formed over the first etching stop layer (ESL) and the first insulating layer is formed over the first etching stop layer (ESL). In one or more of the foregoing and following embodiments, the silicon based liner includes silicon oxide and thermally treating the silicon oxide increases a volume of the silicon oxide. In one or more of the foregoing and following embodiments, a thickness of the silicon based liner is in a range from 1 nm to 5 nm. In one or more of the foregoing and following embodiments, the silicon based liner includes silicon oxycarbonitride (SiOCN).

According to another aspect of the present disclosure, in a method of manufacturing a semiconductor device includes forming a dummy gate structure over a substrate, the dummy gate structure including a dummy gate dielectric layer and a dummy gate electrode layer; forming sidewall spacers including one or more layers of insulating materials on sidewalls of the dummy gate structure; forming a silicon based liner over the sidewall spacers, wherein a thickness of the silicon based liner is greater at a base of the dummy gate structure than a thickness of the silicon based liner at a top of the dummy gate structure; forming a first insulating layer over the silicon based liner; thermally treating the silicon based liner and the first insulating layer, and thereby reduce a volume of the first insulating layer and increase a volume of the silicon based liner; removing the dummy gate structure to form a gate space in the first insulating layer, wherein a gate CD at or adjacent a top portion of the gate space is larger than a gate CD at or adjacent a bottom portion of the gate space; and filling the gate space with a high-k dielectric layer and a first conductive layer. The dummy gate electrode has a width Wg and the gate space has a width Ws at or adjacent a top of the dummy gate structure, and the width Ws is smaller than Wg. In one or more of the foregoing and following embodiments, the silicon based liner includes silicon oxide and thermally treating the silicon oxide increases a volume of the silicon oxide. In one or more of the foregoing and following embodiments, a thickness of the silicon based liner is in a range from 1 nm to 5 nm. In one or more of the foregoing and following embodiments, before forming the first insulating layer and the silicon based liner, the method includes forming a first etching stop layer (ESL) over the dummy gate structures. The silicon based liner is formed over the first etching stop layer (ESL), the first insulating layer is formed over the first etching stop layer (ESL), and a thickness of the first insulating layer is less at or adjacent a bottom portion of the dummy gate structure than at or adjacent a top portion of the dummy gate structure. In one or more of the foregoing and following embodiments, the sidewall spacers include one or more layers of a silicon nitride based material. In one or more of the foregoing and following embodiments, reducing the volume of the first insulating layer causes the first insulating layer to separate from the silicon based liner and thereby form a gap between the first insulating layer and the silicon based liner. In one or more of the foregoing and following embodiments, the increase in the volume of the silicon based liner decreases the gap between the first insulating layer and the silicon based liner. In one or more of the foregoing and following embodiments, the method further includes performing a planarization operation to remove upper portions of the dummy gate structure, the first insulating layer, and the silicon based liner prior to removing the dummy gate structure to form the gate space.

In accordance with yet another aspect of the present disclosure, a semiconductor device includes a channel region; a gate dielectric layer disposed over the channel region; a gate electrode layer disposed over the gate dielectric layer; gate sidewall spacers between which the gate electrode layer and gate dielectric layer are disposed; and a source and a drain. In a cross section along a source-to-drain direction, distance between the gate sidewall spacers varies along a vertical direction such that gate space between adjacent gate sidewall spacers is V-shaped. In one or more of the foregoing and following embodiments, the gate sidewall spacers include one or more layers of a silicon nitride based material. In one or more of the foregoing and following embodiments, a silicon based liner is disposed about the gate sidewall spacers and over the source and the drain.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a dummy gate structure over a substrate, the dummy gate structure including a dummy gate dielectric layer and a dummy gate electrode layer;
   forming sidewall spacers including one or more layers of insulating materials on sidewalls of the dummy gate structure;
   forming a silicon based liner over the sidewall spacers;
   forming a first insulating layer over the silicon based liner;
   thermally treating the silicon based liner and the first insulating layer, and thereby causing a reduction in a volume of the first insulating layer and an increase in a volume of the silicon based liner;
   removing the dummy gate structure to form a gate space in the first insulating layer; and
   filling the gate space with a high-k dielectric layer and a first conductive layer,
   wherein the dummy gate electrode layer has a width Wg and the gate space has a width Ws at or adjacent a top of the dummy gate structure, and the width Ws is smaller than Wg.

2. The method of claim 1, wherein the reduction in the volume of the first insulating layer causes the first insulating layer to separate from the silicon based liner and thereby form a gap between the first insulating layer and the silicon based liner.

3. The method of claim 2, wherein the increase in the volume of the silicon based liner decreases the gap between the first insulating layer and the silicon based liner.

4. The method of claim 3, wherein removing the dummy gate structure includes removing the dummy gate electrode layer to reduce stresses generated from the increase in the volume of the silicon based liner, wherein the reduction in the stresses causes the silicon based liner to occupy the gap.

5. The method of claim 1, wherein the silicon based liner includes silicon and thermally treating the silicon based liner converts the silicon based liner into silicon oxide.

6. The method of claim 1, wherein before forming the first insulating layer and the silicon based liner, the method further comprises:
   forming a first etching stop layer (ESL) over the dummy gate structure, wherein the silicon based liner is formed over the first etching stop layer (ESL) and the first insulating layer is formed over the first etching stop layer (ESL).

7. The method of claim 1, wherein the silicon based liner includes silicon oxide and thermally treating the silicon oxide increases a volume of the silicon oxide.

8. The method of claim 1, wherein a thickness of the silicon based liner is in a range from 1 nm to 5 nm.

9. The method of claim 1, wherein the silicon based liner includes silicon oxycarbonitride (SiOCN).

10. A method of manufacturing a semiconductor device, the method comprising:

forming a dummy gate structure over a substrate, the dummy gate structure including a dummy gate dielectric layer and a dummy gate electrode layer;

forming sidewall spacers including one or more layers of insulating materials on sidewalls of the dummy gate structure;

forming a silicon based liner over the sidewall spacers, wherein a thickness of the silicon based liner is greater at a base of the dummy gate structure than a thickness of the silicon based liner at a top of the dummy gate structure;

forming a first insulating layer over the silicon based liner;

thermally treating the silicon based liner and the first insulating layer, and thereby reduce a volume of the first insulating layer and increase a volume of the silicon based liner;

removing the dummy gate structure to form a gate space in the first insulating layer, wherein a gate critical dimension (CD) at or adjacent a top portion of the gate space is larger than a gate CD at or adjacent a bottom portion of the gate space; and filling the gate space with a high-k dielectric layer and a first conductive layer, wherein the dummy gate electrode layer has a width Wg and the gate space has a width Ws at or adjacent a top of the dummy gate structure, and the width Ws is smaller than Wg.

11. The method of claim 10, wherein the silicon based liner includes silicon oxide and thermally treating the silicon oxide increases a volume of the silicon oxide.

12. The method of claim 10, wherein a thickness of the silicon based liner is in a range from 1 nm to 5 nm.

13. The method of claim 10, wherein before forming the first insulating layer and the silicon based liner, the method further comprises:

forming a first etching stop layer (ESL) over the dummy gate structure, wherein the silicon based liner is formed over the first etching stop layer (ESL), the first insulating layer is formed over the first etching stop layer (ESL), and a thickness of the first insulating layer is less at or adjacent a bottom portion of the dummy gate structure than at or adjacent a top portion of the dummy gate structure.

14. The method of claim 13, wherein the sidewall spacers include one or more layers of a silicon nitride based material.

15. The method of claim 10, wherein reducing the volume of the first insulating layer causes the first insulating layer to separate from the silicon based liner and thereby form a gap between the first insulating layer and the silicon based liner.

16. The method of claim 15, wherein an increase in the volume of the silicon based liner decreases the gap between the first insulating layer and the silicon based liner.

17. The method of claim 10, further comprising performing a planarization operation to remove upper portions of the dummy gate structure, the first insulating layer, and the silicon based liner prior to removing the dummy gate structure to form the gate space.

18. A semiconductor device comprising:
a channel region;
a gate dielectric layer disposed over the channel region;
a gate electrode layer disposed over the gate dielectric layer;
gate sidewall spacers between which the gate electrode layer and gate dielectric layer are disposed; and
a source and a drain, wherein
in a cross section along a source-to-drain direction, a distance between the gate sidewall spacers decreases along a vertical direction from a top of the gate sidewall spacers to a middle of the gate sidewall spacers and increases along the vertical direction from the middle of the gate sidewall spacers to a bottom of the gate sidewall spacers, such that a gate space between adjacent gate sidewall spacers is arc-shaped.

19. The semiconductor device of claim 18, wherein the gate sidewall spacers include one or more layers of a silicon nitride based material.

20. The semiconductor device of claim 18, further comprising:
a silicon based liner disposed over the gate sidewall spacers and over the source and the drain.

* * * * *